(12) United States Patent
Ozawa et al.

(10) Patent No.: US 7,303,946 B1
(45) Date of Patent: Dec. 4, 2007

(54) METHOD OF MANUFACTURING A SEMICONDUCTOR DEVICE USING AN OXIDATION PROCESS

(75) Inventors: Yoshio Ozawa, Yokohama (JP); Yasumasa Suizu, Tokyo (JP); Yoshitaka Tsunashima, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 424 days.

(21) Appl. No.: 09/559,757

(22) Filed: Apr. 27, 2000

(30) Foreign Application Priority Data

Apr. 28, 1999 (JP) ............................... 11-121689
Apr. 24, 2000 (JP) ............................ 2000-122018

(51) Int. Cl.
*H01L 21/00* (2006.01)

(52) U.S. Cl. .................. 438/165; 438/635; 438/770; 438/911; 438/966; 438/FOR. 479; 257/E21.284; 257/E21.301

(58) Field of Classification Search ........ 257/356–360, 257/410.2, 632, 635, 638, 639, 649, E21.284, 257/E21.301; 438/201, 211, 437, 438, 165, 438/635, 770, 911, 966, FOR. 479

See application file for complete search history.

(56) References Cited

U.S. PATENT DOCUMENTS

| | | | |
|---|---|---|---|
| 5,330,935 A | | 7/1994 | Dobuzinsky et al. |
| 5,412,246 A | | 5/1995 | Dobuzinsky et al. |
| 5,602,048 A | * | 2/1997 | Komori et al. ............... 437/43 |
| 5,620,910 A | * | 4/1997 | Teramoto .................... 438/151 |
| 5,646,054 A | * | 7/1997 | Rhee ........................... 437/30 |
| 5,693,578 A | | 12/1997 | Nakanishi et al. |
| 5,693,974 A | * | 12/1997 | Hsu et al. .................... 257/369 |
| 5,907,183 A | * | 5/1999 | Takeuchi ..................... 257/640 |
| 5,917,221 A | * | 6/1999 | Takemura ................... 257/365 |
| 5,959,329 A | * | 9/1999 | Tomita et al. .............. 257/321 |
| 6,414,352 B2 | * | 7/2002 | Hisamune ................... 257/320 |
| 6,707,120 B1 | * | 3/2004 | Aminzadeh et al. ........ 257/411 |

FOREIGN PATENT DOCUMENTS

| | | |
|---|---|---|
| JP | 7-183513 | 7/1995 |
| JP | 8-250720 | 9/1996 |
| JP | 9-148543 | 6/1997 |
| JP | 10-32328 | 2/1998 |
| JP | 10-163197 | 6/1998 |
| JP | 10-223771 | 10/1998 |

OTHER PUBLICATIONS

L.D. Landau and E.M. Lifschitz, "Electrodynamics of Continuous Media", vol. 8, in Course of Theoretical Physics, Pergamon Press, 1960 (first English edition 1960, reprinted 1963, 1975, 1981) (Library of Congress Catalog Card: 60-14731); pp. 110-111.*
Wolf et al. "Solicon Processing for the VLSI Era" vol. 1, Pattice Press, 1986, pp. 161-238.*
Office Action, dated May 14, 2004, in Japanese Patent Application No. 2000-122018, and English-language translation.

* cited by examiner

*Primary Examiner*—Matthew Smith
*Assistant Examiner*—Thanh Van Pham
(74) *Attorney, Agent, or Firm*—Finnegan, Henderson, Farabow, Garrett & Dunner, L.L.P.

(57) ABSTRACT

A method of manufacturing a MOS transistor incorporating a silicon oxide film serving as a gate insulating film and containing nitrogen and a polycrystalline silicon film serving as a gate electrode and containing a dopant and arranged such that the gate electrode is formed on the gate electrode insulating film, and an oxidation process using ozone is performed to sufficiently round the shape of the lower edge of the gate electrode.

10 Claims, 15 Drawing Sheets

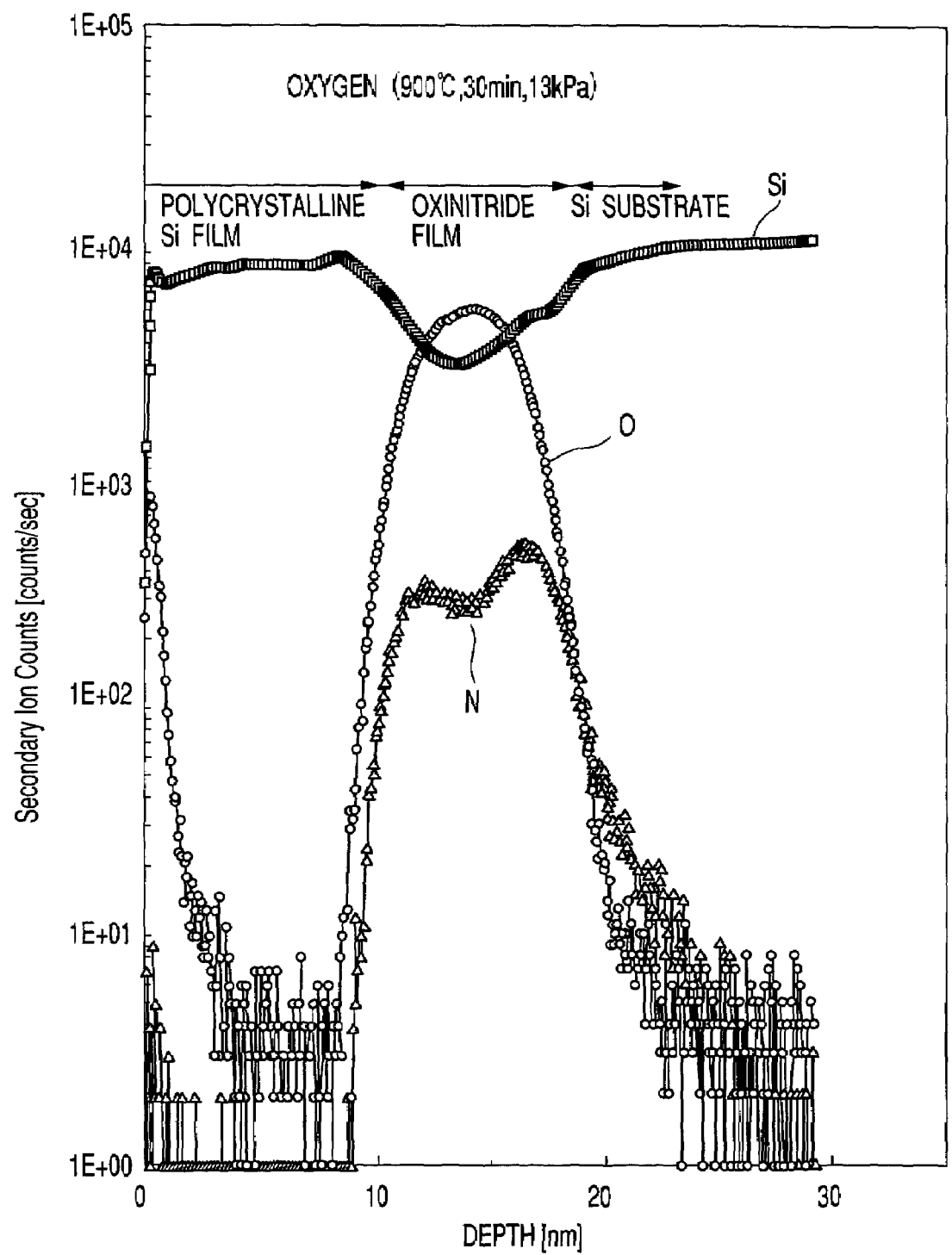
F I G. 13

METHOD OF MANUFACTURING A SEMICONDUCTOR DEVICE USING AN OXIDATION PROCESS

CROSS-REFERENCE TO RELATED APPLICATIONS

This application is based upon and claims the benefit of priority from the prior Japan Patent Applications No. 11-121689, Apr. 28, 1999; and No. 2000-122018, Apr. 24, 2000, the entire contents of which are incorporated herein by reference.

BACKGROUND OF THE INVENTION

A source/drain region and a gate electrode of a MOS transistor are electrically insulated from each other by a gate insulating film present between the source/drain region and the gate electrode. Since the lower edge of the gate electrode is formed into a sharp shape, electric fields are concentrated on the lower edge of the gate electrode. The enhancement of the electric fields causes dielectric failure in insulating between the source/drain region and the gate electrode.

The gate insulating film adjacent to the lower edge of the gate electrode sustains process damage owing to etching which is performed when the gate electrode is formed or ion implantation which is performed when the source/drain region is formed. The deterioration in the insulation resistance is caused by the process damage. The deterioration in the insulation resistance results in the dielectric failure to becomes more critical.

The foregoing states also applies to the lower edge of a floating gate electrode of a flash memory cell as well as the lower edge of the gate electrode of the MOS transistor. That is, the foregoing fact usually applies to an insulating gate transistor of a type incorporating a gate electrode having a sharp edge and disposed opposite to a semiconductor substrate through a gate insulating film.

As a conventional technique for overcoming the foregoing problem of the dielectric failure, a post-oxidation process is known. As shown in FIG. 10A, the foregoing process has the steps of sequentially forming a silicon oxide film 92 and a low-resistance polycrystalline silicon film 93 containing dopant on a silicon substrate 91. Then, the polycrystalline silicon film 93 is formed into a predetermined pattern, and then, as shown in FIG. 10B, thermal oxidation is performed in an oxygen ($O_2$) atmosphere so that a post oxide film 94 is formed. Since the post oxide film 94 is formed, the sharp lower edge of the polycrystalline silicon film 93 can be rounded. Thus, the electric field at the lower edge is moderated.

Birds beak oxidation occurring when the thermal oxidation is performed enlarges the distance between the lower edge of the polycrystalline silicon film 93 and the silicon substrate 91. Thus, the electric field at the lower edge can be weakened. When the distance between the substrate and the lower edge is elongated, the distribution of the electric fields is not changed. The overall intensity of the electric field is, however, weakened, causing the electric field at the lower edge to be moderated.

The silicon oxide film 92 present adjacent to the edge of the polycrystalline silicon film 93 and which has sustained the process damage is permitted to restore its process damage owing to the post oxidation which is additional oxidation. Thus, the film quality of the silicon oxide film 92 can be improved so that the insulation resistance of the silicon oxide film 92 is improved.

The foregoing post oxidation process attains a similar effect when an overetching structure as shown in FIGS. 11A and 11B is subjected to the process. FIGS. 11A and 11B show a structure that also the silicon oxide film 92 which is present below the polycrystalline silicon film 93 which must be removed when the polycrystalline silicon film 93 is patterned. Moreover, the surface of the silicon substrate 91 below the silicon oxide film 92 has been removed.

As described above, employment of the post oxidation process enables a dielectric failure caused from enhancement of electric fields at the lower edge of the polycrystalline silicon film 93 to be avoided.

As a conventional method for converting a silicon nitride film into silicon oxide film, a thermal oxidation method using steam or oxygen ($O_2$) gas as an oxidizer, or a plasma oxidation method using oxygen gas or ozone gas as a source and arranged to be performed in a plasma atmosphere is known.

The foregoing method has the following problems. When the thermal oxidation method is employed, a great thermal budget is required to be performed at high temperatures for a long time. When the surface of a silicon nitride film formed by an LPCVD method is formed into silicon oxide film having a thickness of 5 nm, great thermal budget must be performed at 950° C. for about one hour even when a steam oxidation method exhibiting a high oxidation rate is employed.

When the thermal budget is too great, dopant in the silicon substrate encounters thermal diffusion.

Thus, the concentration profile of the dopant is undesirably changed. Therefore, the thermal oxidation method cannot easily be applied to a process for treating small devices.

When the plasma oxidation method is employed, the body which must be processed is exposed to plasma. Therefore, for example, the gate insulating film sustains plasma damage. The foregoing plasma damage causes deterioration in the reliability of the insulating film and undesirably change in the characteristics of the device.

The conventional techniques and their problems will now be described.

FIGS. 12A to 12D are cross sectional views showing steps of a method of forming a small-size MOS transistor superior to the lithography performance. As shown in FIG. 12A, a gate insulating film 102, a polycrystalline film 103 which is formed into a gate electrode and a silicon nitride film 104 which serves as a mask (a SiN pattern) for use when the polycrystalline silicon film 103 is etched are sequentially formed on a silicon substrate 101 having a surface into which dopant has been introduced by an ion implantation method.

Then, as shown in FIG. 12B, resist is applied to the overall surface to transfer a gate pattern having a minimum width which can be realized by the lithography technique to the resist. Thus, a resist pattern 107 (a portion indicated with a dashed line) is formed. Then, an oxidation process which is process under a reduced pressure and using radical oxygen is performed to reduce the width of the resist pattern 107. The drawing shows the resist pattern 105 having the reduced width with a solid line.

Then, as shown in FIG. 12C, the resist pattern 105 is used as a mask to etch the silicon nitride film 104 by RIE (Reactive Ion Etching) method so that a SiN pattern is formed. Then, the resist pattern 105 is removed.

Then, as shown in FIG. 12D, the residual silicon nitride film (the SiN pattern) 104 is used as a mask to etch the polycrystalline silicon film 103 by the RIE to form a gate electrode having a small size superior to the performance of the lithography.

Finally, as shown in FIG. 12D, the gate electrode (the polycrystalline silicon film) 103 is used as a mask to implant dopant ions into the surface of the substrate. Then annealing is performed to activate the dopant so that a source/drain region 106 is formed. Thus, a MOS transistor is manufactured.

The foregoing conventional method requires the film thickness of the resist which is applied in the step shown in FIG. 12B to be about 500 nm in a usual case. Therefore, when the gate electrode 103 having a width of, for example, 50 nm is formed, the aspect ratio of the resist pattern 105 is undesirably raised to 10.

Therefore, the shape of the resist pattern 105 easily disperses. As a result, there arises a problem in that the shape of the gate electrode 103 dispersed. Another problem arises in that the resist pattern 105 falls.

As an alternative to reduction in the width of the resist pattern 105, a technique is known with which the width of the SiN pattern film 104 is reduced. That is, the conventional method has the arrangement that the SiN pattern 104 having the minimum width which can be realized by the lithography technique is formed, and then the oxidation process is performed to reduce the SiN pattern 104.

However, the width of the SiN pattern 104 cannot easily be reduced to a required width. When the steam oxidation method exhibiting a high oxidation rate is employed, thermal budget at 950° C. for one or more hours must be performed to reduce the width of the SiN pattern 104 by 10 nm. When the foregoing high-temperature and long oxidation process is performed, there arises a problem in that the concentration profile of the dopant in the silicon substrate 101 is considerably changed.

BRIEF SUMMARY OF THE INVENTION

An object of the present invention is to provide a semiconductor device which is capable of preventing dielectric failure from occurring at the edge of a conductive film of a structure in which the conductive film including silicon patterned on an insulating film containing silicon and nitrogen is formed and a manufacturing method therefor.

A semiconductor device according to the present invention comprises: a semiconductor substrate having a main plane which has a first region and a second region having the surface which is lower than the surface of the first region such that the first region and the second region are connected to each other; a first insulating film formed on the first region and containing silicon, nitrogen and oxygen; a conductive film formed on the first insulating film and containing silicon; and a second insulating film formed on the second region, containing silicon and oxygen and arranged to be in contact with the conductive film and the first insulating film.

A method of manufacturing a semiconductor device according to the present invention comprises the steps of: forming an insulating film containing silicon and nitrogen on a semiconductor substrate; forming a film which must be processed and which contains silicon on the insulating film; processing the film which must be processed to cause a portion of the insulating film to expose to the outside; and subjecting a semiconductor structure obtained owing to the steps to an oxidation process using an oxidizing gas containing either of ozone or oxygen radicals.

A method of manufacturing a semiconductor device according to the present invention comprises the steps of: forming an insulating film containing silicon and nitrogen on a semiconductor substrate; forming a film which must be processed and which contains silicon on the insulating film; processing the film which must be processed to cause a portion of the insulating film to expose to the outside; subjecting a semiconductor structure obtained owing to the steps to an oxidation process using an oxidizing gas containing either of ozone or oxygen radicals; and subjecting the semiconductor structure subjected to the oxidation process to at least either of a nitridation process or an additional oxidation process.

The inventors of the present invention has found a fact as a result of studies. That is, when an insulating film containing nitrogen and silicon is oxidized in an atmosphere containing ozone or oxygen radicals, oxidation proceeds while desorption of nitrogen in the insulating film is being performed. Thus, the thickness is enlarged.

FIGS. 13 and 14 show an example of results of experiments. Samples for use in the experiments were manufactured as follows. A thermal oxide film (a silicon oxide film) having a thickness of 7 nm was formed on a silicon wafer. Then, the thermal oxide film was nitrided in 950° C. ammonia atmosphere to form an insulating (a silicon oxinitride film) having the thermal oxide film into which nitrogen has been introduced.

Then, the foregoing sample was used to perform two types of oxidation experiments. One of the experiments was performed such that the sample was introduced into a vertical batch oxidizing furnace. Then, oxygen gas was introduced into the vertical batch oxidizing furnace to subject the sample to an oxidation process. The oxidation process was performed at 900° C. for 30 minutes under 13 kPa. Another experiment was performed such that the sample was introduced into the vertical batch oxidizing furnace. Then, mixed gas of ozone and oxygen (ozone was 5%) was introduced into the vertical batch oxidizing furnace so as to subject the sample to the oxidation process. The oxidation process was performed at 900° C., for 30 minutes under 130 Pa.

The samples subjected to the foregoing oxidation processes were examined such that the concentration profile of nitrogen and that of oxygen in the silicon oxinitride film were SIMS-analyzed (the SIMS analysis was performed after the oxidation process has been performed and a polycrystalline silicon film having a thickness of 10 nm was formed on the silicon oxinitride).

FIG. 13 shows results of SIMS analysis realized when oxygen gas was used to perform the oxidation process. FIG. 14 shows results of SIMS analysis realized when the mixed gas of ozone and oxygen was used to perform the oxidation process.

As can be understood from the drawings, the oxidation process using ozone permits nitrogen in the surface of the silicon oxinitride film to easily be desorbed as compared with the oxidation process which does not use ozone. Thus, the thickness of the silicon oxinitride film can considerably be enlarged owing to proceeding of the oxidation.

When nitrous oxide ($N_2O$) or nitrogen monoxide (NO) is used to introduce nitrogen into the silicon oxide film instead of ammonia, the concentration of nitrogen in the silicon oxide film is raised at the interface with the silicon substrate. Also in the foregoing case, oxidation in an atmosphere containing ozone results in considerable reduction in the concentration of nitrogen in the silicon oxinitride film adjacent to the substrate. Thus, the thickness can considerably be enlarged owing to proceeding of the oxidation.

Even when the sample incorporating silicon wafer having a surface on which silicon nitride film is formed instead of the silicon oxinitride film, oxidation in the atmosphere containing ozone results in considerable desorption of nitrogen in the surface portion of the silicon nitride film. As a result, oxidation processes in the surface of the silicon nitride film proceed. Thus, the surface of the silicon nitride film is converted into silicon oxide film.

As a results of the experiments, the nitrogen desorption phenomenon in the silicon oxinitride film occurs in the foregoing oxidation method when the ratio [N]/([O]+[N]) of nitrogen in the film is higher than 0% and not higher than 100%.

The foregoing phenomenon as well as occurs when oxidation is performed in an atmosphere containing oxygen radicals.

The oxygen radicals may be generated in an oxidizing furnace similarly to the plasma oxidizing method or generated on the outside of the oxidizing furnace similarly to a remote plasma oxidizing method so as to be introduced into the oxidizing furnace. Alternatively, the oxygen radicals may be generated on the surface of the sample. Oxygen radicals are generated on the surface of the sample by a method with which oxygen gas and hydrogen gas are introduced into the oxidizing furnace. Then, the surface of the sample is heated to desociate the oxygen gas at the surface of the sample to generate the oxygen radicals.

It has been reported that main species in the ozone oxidizing process are oxygen radicals generated due to desociation of ozone. Therefore, the similar phenomenon occurs with ozone oxidation and oxidation with oxygen radicals.

Therefore, when oxidation is performed in the atmosphere containing ozone or oxygen radicals having the above-mentioned effect as the present invention, oxidation sufficiently proceeds at the edge of the conductive film in the structure having the conductive film containing patterned silicon and formed on the insulating film containing silicon and nitrogen. As a result, the round shape which is effective to moderate the electric field can be formed. As a result, dielectric failure can effectively be prevented.

Oxidation proceeds quickly in the surface (the second region) of the substrate below the portion of the insulating film which is not covered with the conductive film as compared with the surface (the first region) of the surface below a portion of the insulating film covered with the conductive film. Therefore, the second region is lowered as compared with the first region.

Another object of the present invention is to provide a method of manufacturing a semiconductor device which is capable of forming a pattern composed of a silicon nitride film superior to the performance of the lithography such that only a small thermal budget is required and free from any plasma damage.

To achieve the foregoing object, a method of manufacturing a semiconductor device according to the present invention comprises the steps of: forming an insulating film containing a silicon nitride film on a film including a silicon film and arranged to be processed; processing the insulating film by using lithography and etching to form a pattern composed of the insulating film; subjecting the pattern in an atmosphere containing either of oxygen radicals or ozone to convert the exposed surface of the silicon nitride film into a silicon oxide film; fining the pattern by removing the silicon oxide film; and processing the film arranged to be processed by transferring the fined pattern to the film arranged to be processed.

As a result of study performed by the inventors of the present invention, a process of oxidizing the silicon nitride film in the atmosphere containing oxygen radicals or ozone enables the surface of the silicon nitride film to easily be converted into the silicon oxide film at a temperature of 850° C. or lower. When the conditions are adjusted, the conversion can be realized at 800° C. or lower.

FIGS. 17 and 18 show examples of results of experiments

FIGS. 17 and 18 show microscopic photographs of a semiconductor structures including the silicon nitride film oxidized by the oxidizing method using dry oxygen ($O_2$) as the oxidizing species and ozone ($O_3$) as the oxidizing species.

The semiconductor structure was formed as follows. That is, the silicon nitride film and a TEOS oxide film are sequentially formed on the silicon substrate. Then, the TEOS oxide film, the silicon nitride film and the silicon substrate were etched to form projections. Then, phosphoric acid was used to fine the TEOS oxide film and the silicon nitride film so that the semiconductor structure was formed. In the drawing, the projections of the silicon substrate, the silicon nitride film and the TEOS oxide film are formed upwards.

The oxidation method using dry oxygen (10%) as the oxidizing species was performed such that the oxidizing temperature was 1000° C. and the oxidizing duration was 69 minutes. In the foregoing case, the thickness of the silicon oxide film formed on the surface of the silicon substrate was 15 nm. The oxidizing method using ozone (partial pressure was 133.322 Pa=1 Torr) as the oxidizing species was performed such that the oxidizing temperature was 850° C. and the oxidizing duration was 240 minutes. In the foregoing case, the thickness of the silicon oxide film formed on the surface of the silicon substrate was 11 nm.

As can be understood from FIGS. 17 and 18, the oxidizing method using dry oxygen cannot convert the surface layer of the silicon nitride film into the silicon oxide film. The oxidizing method using ozone can convert the surface layer of the silicon nitride film into the silicon oxide film. Also in a case where oxygen radicals are employed instead of the ozone, a similar result was obtained.

Therefore, the present invention using the oxidizing atmosphere containing ozone or oxygen radicals can convert the surface of the silicon nitride film into the silicon oxide film such that only a small thermal budget is required and any plasma damage does not occur. Therefore, when the silicon oxide film is removed, a pattern (a SiN pattern) composed of the silicon nitride film exceeding the performance of the lithography can be formed.

When the SiN pattern is employed as the etching mask for the polycrystalline silicon film, the etching rate of the SiN pattern can sufficiently be lowered as that for the polycrystalline silicon film. Therefore, only a small thickness is required for the SiN pattern. As a result, dispersion of the shape of the SiN pattern can sufficiently be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

FIG. 13 is a graph showing a concentration profile of each of silicon, oxygen and nitrogen of a silicon oxinitride film oxidized in an oxygen atmosphere;

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Problems detected by the inventors of the present invention which are motivation of the present invention will now be described prior to describing embodiments of the present invention. The foregoing problem arises when silicon oxinitride film or silicon nitride film is employed instead of the silicon oxide film 92 shown in FIGS. 10A and 10B.

Figure 15A:
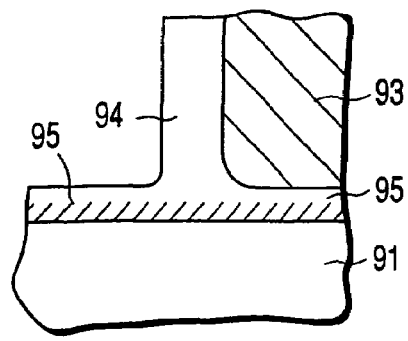
FIGS. 15A to 15C are enlarged views showing a device structure (no overetching of the substrate) obtained by conventional post oxidation performed in an oxygen gas atmosphere.
Figure 15B:
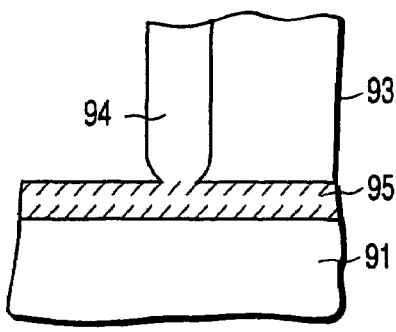
Figure 15C:
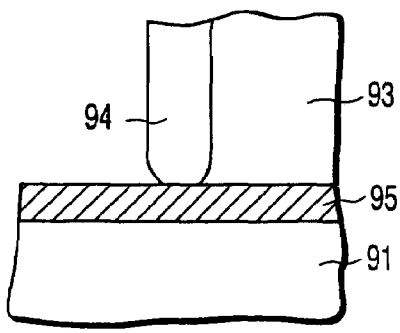

FIGS. 15A to 15C show the difference in the shape of the silicon oxide film (silicon oxinitride film) 95 containing nitrogen which is realized after post oxidation owing to the concentration profile of nitrogen. A diagonal portion shown in the drawing shows a high concentration region of nitrogen.

The silicon oxinitride film 95 present below a polycrystalline silicon film 93 prevents supply of an oxidizer to the lower edge of the polycrystalline silicon film 93. Therefore, the lower edge of the polycrystalline silicon film 93 owing to the post oxidation becomes insufficient.

When the concentration of nitrogen in the silicon oxinitride film 95 is high, and in particular when the concentration of nitrogen in the silicon oxinitride film 95 adjacent to the polycrystalline silicon film 93 is high, oxidation of the lower edge of the polycrystalline silicon film 93 does not proceed. Therefore, the lower edge of the polycrystalline silicon film 93 is undesirably sharpened as compared with the shape realized before the post oxidation (see FIGS. 15B and 15C).

The foregoing problem becomes critical when the concentration of nitrogen in the silicon oxinitride film 95 is $5\times10^{13}$ $c^{-2}m$ or higher in the interface with the polycrystalline silicon film 93 or the ratio of nitrogen [N]/([O]+[N]) in the silicon oxinitride film 95 adjacent to the polycrystalline silicon film 93 is 1% or higher.

The silicon oxinitride film 95 present on the silicon substrate 91 prevents supply of the oxidizer to the surface of the silicon substrate 91. Therefore, bird's beak oxidation owing to the post oxidation becomes insufficient.

When the concentration of nitrogen in the silicon oxinitride film 95 is high, and in particular when the concentration of nitrogen in the silicon oxinitride film 95 adjacent to the silicon substrate 91 is high, the bird's beak oxidation does not proceed. Therefore, the distance between the lower edge of the polycrystalline silicon film 93 and the silicon substrate 91 cannot be elongated (FIGS. 15A to 15C).

The foregoing problem becomes critical when the concentration of nitrogen in the silicon oxinitride film 95 is $5\times10^{13}$ $cm^{-3}$ or higher in the interface with the silicon substrate 93 or the ratio of nitrogen [N]/([O]+[N]) in the silicon oxinitride film 95 adjacent to the silicon substrate 93 is 1% or higher.

When nitrogen is contained in the surface portion of the silicon oxinitride film 95 exposed after the polycrystalline silicon film 93 has been processed, supply of the oxidizer into the silicon oxinitride film 95 is prevented. Therefore, improvement in the quality of the film owing to recovery of the process damage becomes insufficient (FIGS. 15B and 15C).

Figure 10A:
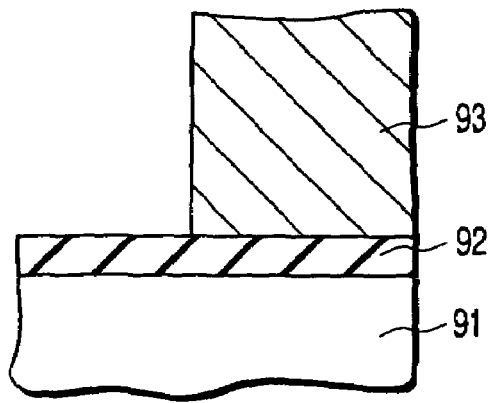
FIG. 10A to 10B are cross sectional views showing a conventional post oxidation process.
Figure 10B:
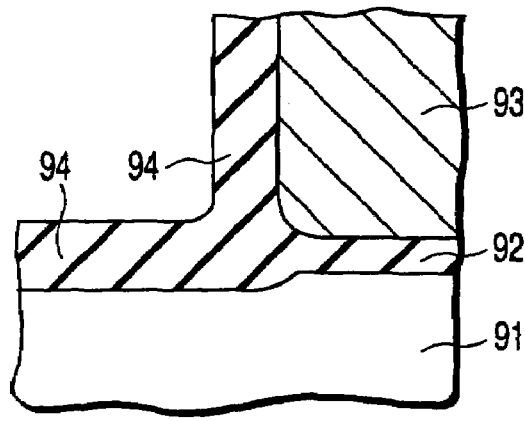
Figure 11A:
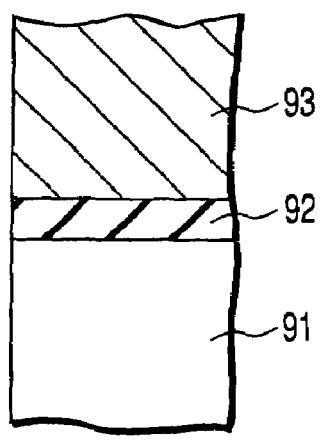
FIGS. 11A and 11B are cross sectional views showing another conventional post oxidation process.
Figure 11B:
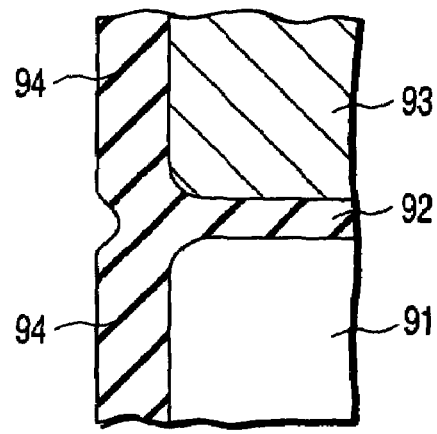
Figure 12A:
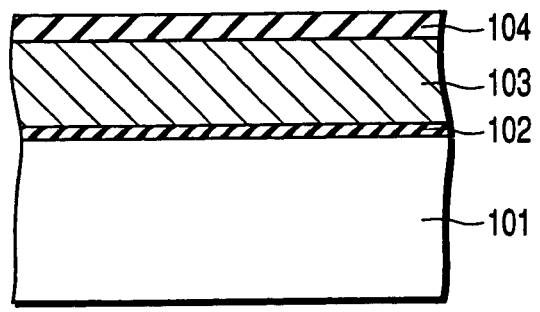
FIGS. 12A to 12D are cross sectional views showing steps of a conventional method of forming a small-size MOS transistor exceeding the performance of the lithography.
Figure 12B:
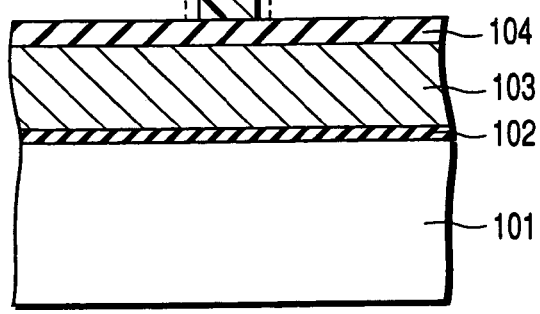
Figure 12C:
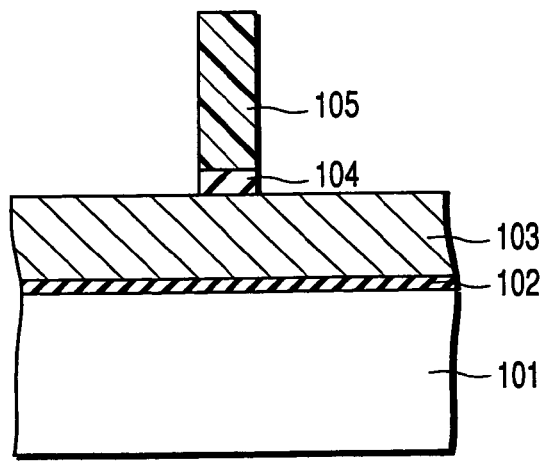
Figure 12D:
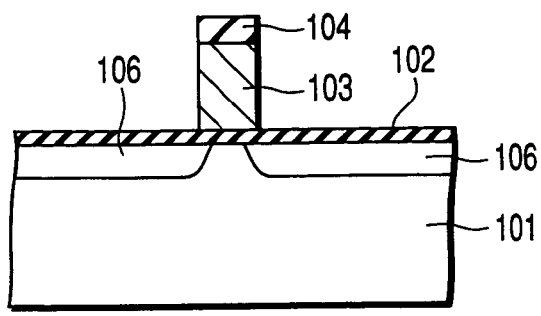
Figure 14:
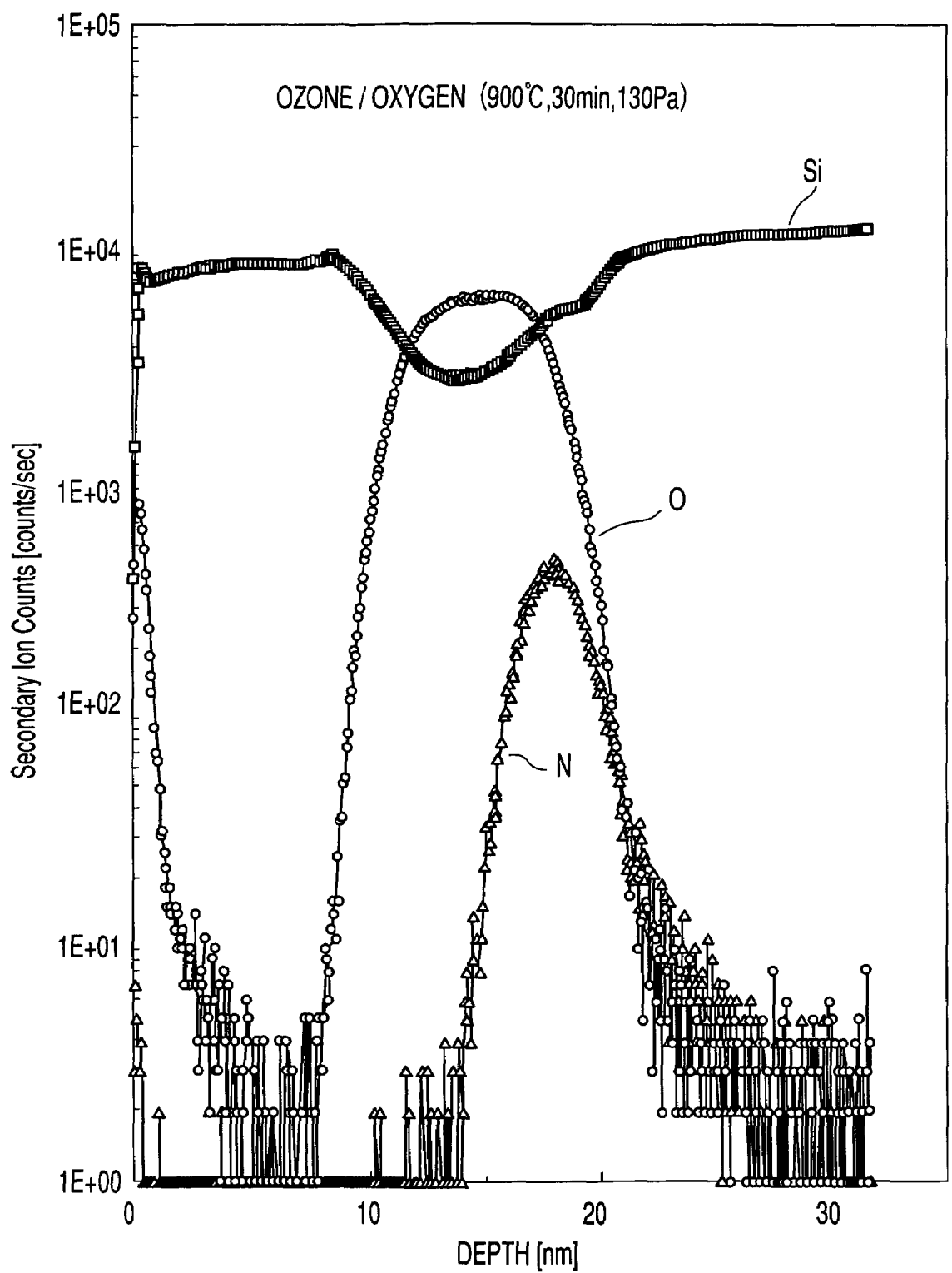
FIG. 14 is a graph showing a concentration profile of each of silicon, oxygen and nitrogen of a silicon oxinitride film oxidized in a mixed gas atmosphere of ozone/oxygen.

The foregoing problem also arises with an overetching structure as shown in FIG. 10A to 10B.

FIRST EMBODIMENT

FIGS. 1A to 1F are cross sectional view showing steps of a method of manufacturing a MOS transistor according to a first embodiment of the present invention.

Figure 1A:
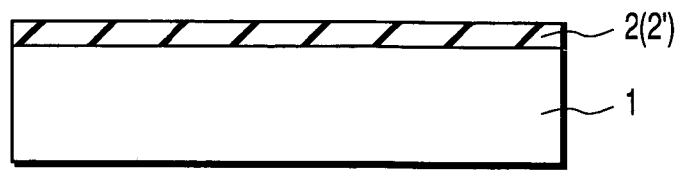
FIGS. 1A to 1F are cross sectional views showing steps of a method of manufacturing a MOS transistor according to a first embodiment of the present invention.

As shown in FIG. 1A, a silicon oxide film (not shown) having a thickness of 3 nm is, by a thermal oxidation method, formed on a flattened surface of the silicon substrate 1. Then, a thermal process is performed in an atmosphere of nitrogen monoxide (NO). Thus, nitrogen is introduced into the portion of the silicon oxide film adjacent to the interface with the substrate by $5\times10^{14}$ cm$^{-2}$. Thus, a silicon oxinitride film 2 serving as the gate insulating film is formed.

Figure 1B:
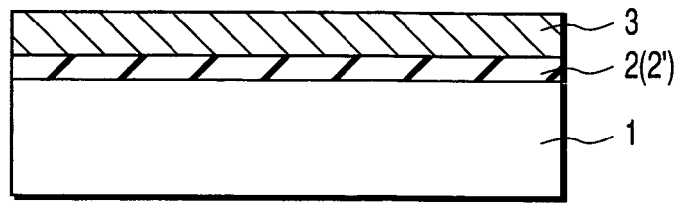

Then, as shown in FIG. 1B, an LPCVD method using monosilane as a source is performed to form an undoped polycrystalline silicon film having a thickness of 150 nm on the silicon oxinitride film 2. Then, boron (B) ions serving as a dopant are introduced into the undoped polycrystalline silicon film. Thus, a low-resistance polycrystalline silicon film 3 which is formed into the gate electrode is formed.

The introduction of the dopant may be performed by the thermal diffusion method. As the dopant, a donor, such as phosphorous (P) or arsenic (As) may be employed. Reference numeral 2' shown in the drawing is given to describe a third embodiment with reference to FIG. 1. Therefore, the foregoing reference numeral does not concern this embodiment. The introduction of the dopant may be performed simultaneously with the film forming step or after the post oxidation (after the polycrystalline silicon film 3 has been formed).

Figure 1C:
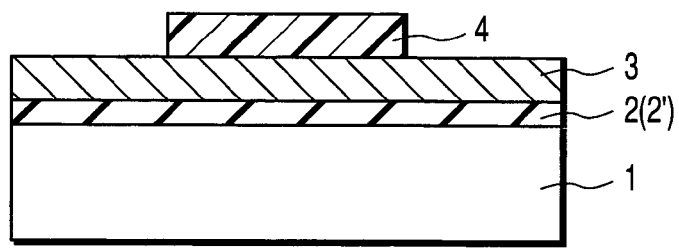

Then, as shown in FIG. 1C, a photoresist is applied to the surface of the polycrystalline silicon film 3, and then a photo-engraving method is employed to perform patterning. Thus, a resist pattern 4 for forming a gate electrode is formed.

Figure 1D:
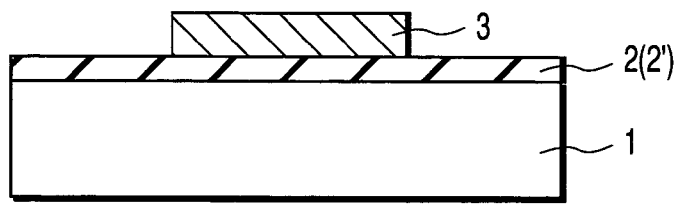

Then, as shown in FIG. 1D, the resist pattern 4 is used as a mask to pattern the polycrystalline silicon film 3 by performing dry etching so that the gate electrode 3 is formed. Then, an ashing method is employed to remove the resist pattern 4. Then, the silicon substrate 1 is introduced into a vertical batch oxidizing furnace.

Figure 1E:
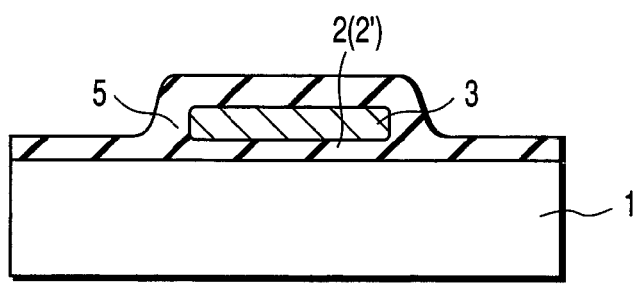

Then, while introducing mixed gas of ozone and oxygen (ozone was 5%) into the vertical batch oxidizing furnace, heat treatment is performed at 900° C., for 10 minutes at 130 Pa. Thus, the surface (the side and upper surfaces) of the gate electrode 3 and the exposed surface of the silicon oxinitride film (the gate insulating film) 2 are oxidized so that a post oxidation film 5 is formed as shown in FIG. 1E. The foregoing oxidation is performed with oxygen radicals which are generated due to the reaction between ozone and oxygen.

The thickness of the post oxidation film 5 is about 5 nm at the side wall of the gate electrode 3. To improve the desociation efficiency of nitrogen in the silicon oxinitride film 2, to enlarge the radius of curvature of the lower edge of the gate electrode 3 and permit quick recovery of the defect of the silicon oxinitride film 2, it is preferable that the oxidizing temperature in the post oxidation step is a high temperature not lower than 900° C.

It is preferable that the oxidizing pressure is a low pressure not higher than 1 kPa to prevent deactivation of ozone in the atmosphere. The post oxidation step may be performed after the source/drain region 6 has been formed next.

Figure 1F:
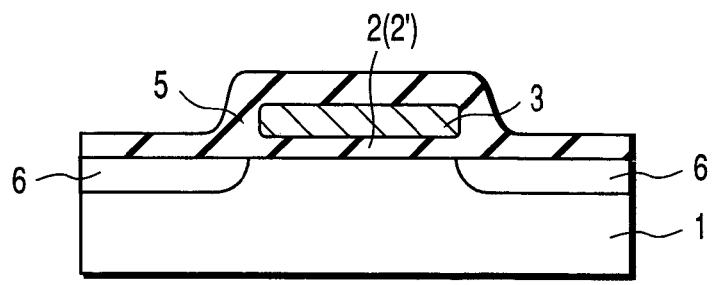

Finally, as shown in FIG. 1F, the gate electrode 3 is used as a mask to introduce the dopant ions into the surface of the substrate. Then, a lamp annealing method is employed to activate the dopant so that the source/drain region 6 is formed in a self-alignment manner. Then, a conventional method is employed to form an interlayer insulating film and metal wirings (not shown) so that the MOS transistor is manufactured.

Figure 2A:
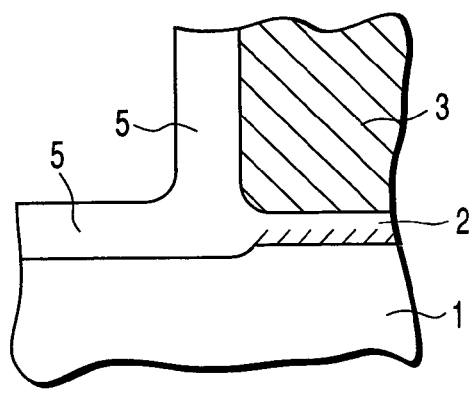
FIGS. 2A to 2D are enlarged views showing a portion adjacent to the lower edge of a gate electrode of the MOS transistor.

FIG. 2A is an enlarged view showing a portion adjacent to the lower edge of the gate electrode 3 formed by the method according to this embodiment.

A diagonal portion in the drawing indicates a region in which the concentration of nitrogen is high. When the concentration of nitrogen in the silicon oxinitride film 2 is not lower than $5\times10^{13}$ cm$^{-2}$ at a position adjacent to the interface with the silicon substrate 1, post oxidation which is performed in the oxygen gas atmosphere (the conventional technique) results in a shape shown in FIG. 15A being undesirably formed. On the other hand, the present invention is arranged to perform the post oxidation in the atmosphere containing ozone. Therefore, nitrogen adjacent to the lower edge of the gate electrode 3 and in the silicon oxinitride film 2 in the region from which the gate electrode has been removed is dissociated. Thus, the bird's beak is formed considerably owing to the proceeding of the oxidation of the silicon substrate 1.

As a result, the shape of the lower edge of the gate electrode 3 can sufficiently be rounded. Moreover, the distance from the lower edge of the gate electrode 3 to the source/drain region 6 can be elongated. Thus, the electric field at the lower edge of the gate electrode 3 and the source/drain region 6 can be moderated. As a result, insulation resistance of the device can be improved.

Figure 2B:
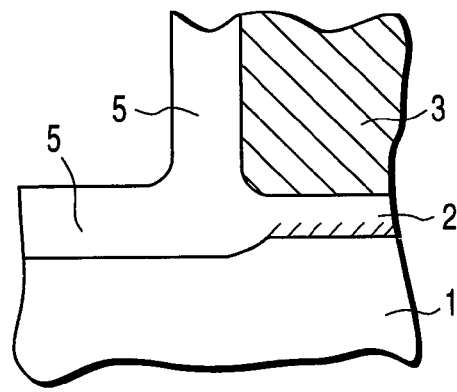

In the step shown in FIG. 1E, the heat treatment is performed in the ozone atmosphere to perform the post oxidation. A similar effect can be obtained when the heat treatment is performed in an oxygen radicals atmosphere. When the thickness of the post oxidation film obtained by performing the post oxidation by using ozone or the oxygen radicals is insufficiently small, usual oxidation is additionally performed after the post oxidation. Thus, a post oxidation film 5 having a required thickness can be formed, as shown in FIG. 2B.

Figure 2C:
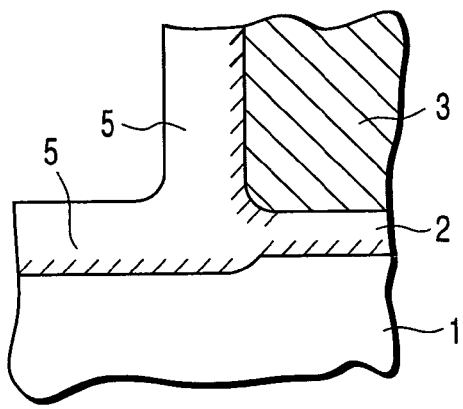

The desociation of nitrogen in the silicon oxinitride film (the gate insulating film) 2 adjacent to the lower edge of the gate electrode 3 owing to the oxidation using ozone or the oxygen radicals is sometimes undesirable. That is, sometimes, there is apprehension that the durability of the carrier deteriorates owing to the desociation of nitrogen, that the resistance against high electric field stress deteriorates or that performance for preventing dispersion of dopant such as boron deteriorates. In the foregoing case, a usual nitrogen introducing process is added which is, for example, heat treatment which is performed in a nitrogen gas atmosphere such as nitrogen monoxide after the post oxidation. Thus, nitrogen can be introduced into the silicon oxinitride film (the gate insulating film) 2 adjacent to the lower edge of the gate electrode 3, as shown in FIG. 2C.

Figure 2D:
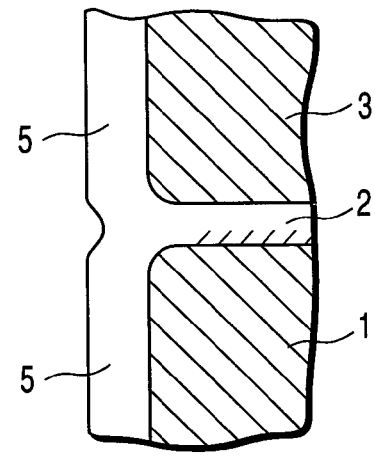
Figure 16A:
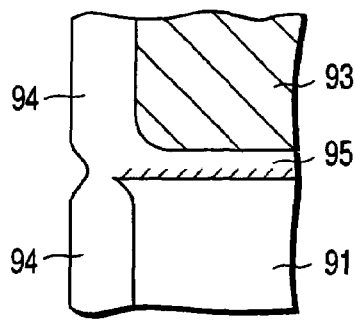
FIGS. 16A to 16C are enlarged views showing a device structure (overetching of the substrate has occurred) obtained by conventional post oxidation performed in an oxygen gas atmosphere.

FIG. 2D is an enlarged view of a portion adjacent to the lower edge of the gate electrode 3 in a case where the etching reaches the silicon oxinitride film 2 when the polycrystalline silicon film 3 is patterned in the step shown in FIG. 1D. In the drawing, a diagonal-line portion indicates a region in which the concentration of nitrogen is high. As compared with a case shown in FIG. 16A in which the post oxidation is performed in the oxygen gas atmosphere (the conventional technique), the present invention arranged to perform the post oxidation in the atmosphere containing ozone causes nitrogen in the portion in the silicon substrate 1 adjacent to the upper edge of the silicon substrate 1 to be desociated. Thus, the post oxidation sufficiently proceeds. Therefore, the shape of the upper edge of the silicon substrate 1 can sufficiently be rounded. As a result, the electric field at the lower edge of the gate electrode 3 and that in the source/drain region 6 are moderated. Hence it follows that the resistance of the device against insulation can be improved.

In the step shown in FIG. 1A, the thermal oxide film (not shown) is subjected to the heat treatment in the nitrogen monoxide atmosphere to form the silicon oxinitride film 2. In a case where the heat treatment is performed in the nitrous oxide ($N_2O$), that is, in a case where nitrogen in the silicon oxinitride film forms a high-concentration layer at the interface with the substrate, a similar effect can be obtained.

In a case where the thermal oxide film is subjected to heat treatment which is performed in an ammonia ($NH_3$) atmosphere, nitrogen in the silicon oxinitride film forms a high-concentration layer at the interface with the substrate and that with the gate electrode. Also in the foregoing case, a similar effect can be obtained.

SECOND EMBODIMENT

FIGS. 3A to 3E are cross sectional views showing steps of a method of manufacturing a flash memory cell according to a second embodiment of the present invention.

Figure 3A:
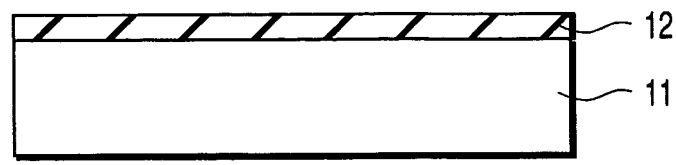
FIGS. 3A to 3E are cross sectional views showing steps of a method of manufacturing a flash memory cell according to a second embodiment of the present invention.

As shown in FIG. 3A, a silicon oxide film (not shown) having a thickness of 8 nm is formed on the flattened surface of a silicon substrate 11 by a thermal oxidation method. Then, heat treatment is performed in an ammonia atmosphere so that a region in which the concentration of nitrogen is high is formed on each of the reverse side (interface with the substrate) and the obverse side such that the peak value of the nitrogen composition ratio [N]/([O]+[N]) is about 10%. Thus, a silicon nitride film 12 serving as a tunnel insulating film is formed. A fact has been confirmed that also the peak value of the nitrogen composition ratio [N]/([O]+[N]) on the reverse side (the interface with the substrate) and the obverse side of the silicon oxinitride film 12 is about 10%.

Figure 3B:
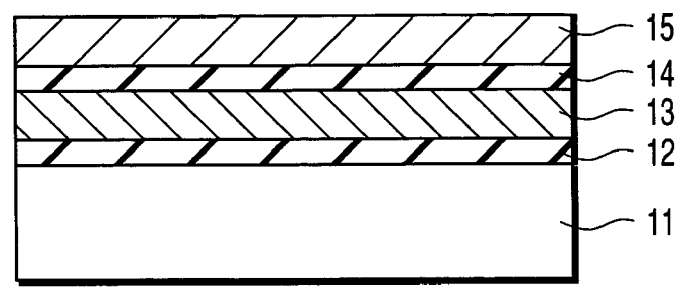

Then, as shown in FIG. 3B, an LPCVD method using monosilane and phosphine as the sources is performed so that a low-resistance polycrystalline silicon film 13 which is formed into a floating gate electrode, to which phosphorous has been doped and which has a thickness of 150 nm is formed on the silicon oxinitride film 12. The introduction of the dopant may be performed by using the thermal diffusion method. A dopant except for phosphorous may be employed. The introduction of the dopant may be performed after the film has been formed.

Then, as shown in FIG. 3B, an insulating film 14 between electrodes and a conductive film (for example, a polycrystalline silicon film containing the dopant) 15 which is formed into a control gate electrode are sequentially formed on the polycrystalline silicon film 13 by a conventional method.

Figure 3C:
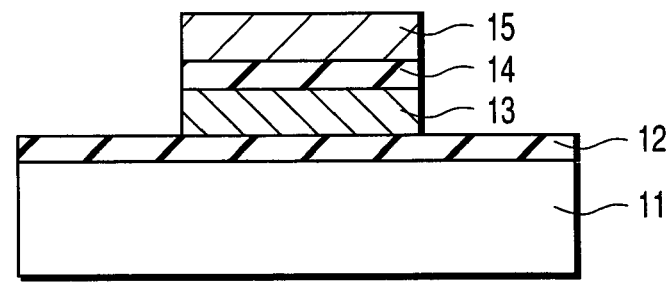

Then, a resist pattern (not shown) is used as a mask to pattern the conductive film 15, the insulating film 14 between electrodes and the polycrystalline silicon film 13 by performing dry etching, as shown in FIG. 3C. Then, an ashing method is employed to remove the resist pattern.

Figure 3D:
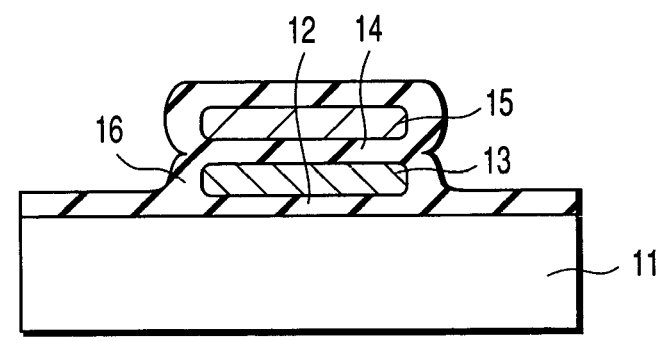

Then, the silicon substrate is introduced into a remote plasma oxidizing furnace, and then heat treatment is performed at 900° C., for 10 minutes at 130 Pa while introducing oxygen radicals into the furnace. Thus, as shown in FIG. 3D, the side wall surface of the polycrystalline silicon film (the floating gate electrode) 13 and the exposed surface of the silicon oxinitride film (the tunnel insulating film) 12 are oxidized so that a post oxidation film 16 is formed. The post oxidation may be performed after a source/drain region 17 has been next formed.

The thickness of the post oxidation film 16 is about 10 nm at the side wall portion of the polycrystalline silicon film (the floating gate electrode) 13. To improve the desociation efficiency of nitrogen in the silicon oxinitride film (the tunnel insulating film) 12, to enlarge the radius of curvature of the lower edge of the floating gate electrode 13 and permit quick recovery of the defect of the tunnel insulating film 12, it is preferable that the oxidizing temperature in the post oxidation step is a high temperature not lower than 900° C.

In a case where the control gate electrode 15 is not a doped silicon film (a low-resistance semiconductor film) and it is a conductive film such as a metal film or a metal silicide film, oxidation of the control gate electrode 15 is not required. In the foregoing case, it is preferable that the post oxidation is performed after the exposed surface of the conductive film is covered with a film, such as a silicon nitride film having a barrier characteristic against the oxidizer.

Figure 3E:
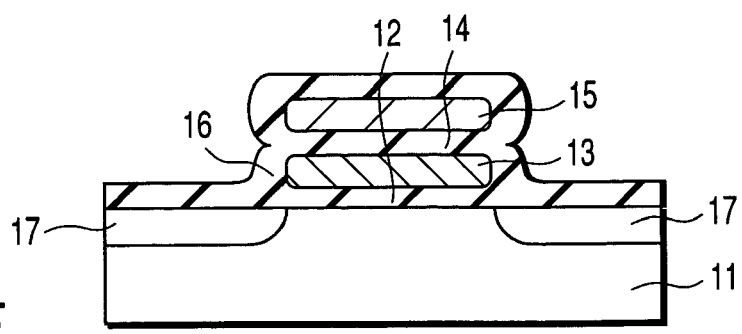

Then, as shown in FIG. 3E, the control gate electrode 15 is used as a mask to introduce the dopant ions into the surface of the substrate. Then, a lamp annealing method is employed to activate the dopant. Thus, the source/drain region 17 is formed in a self-aligning manner. Then, a conventional method is performed to form an interlayer insulating film and metal wirings (not shown). Thus, the MOS transistor is manufactured.

Figure 4A:
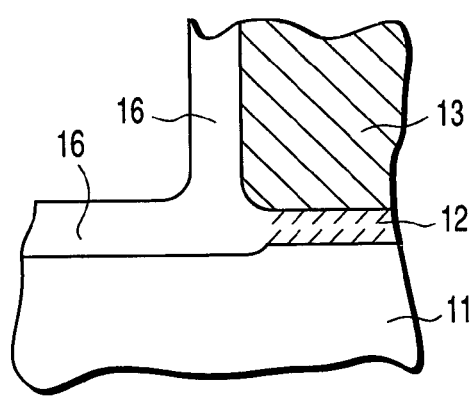
FIGS. 4A and 4B are enlarged views showing a portion adjacent to the lower edge of a floating gate electrode of the flash memory cell.

FIG. 4A is an enlarged view showing a portion adjacent to the lower edge of the floating gate electrode 13. In the drawing, a diagonal-line portion indicates a region in which the concentration of nitrogen is high.

When the nitrogen composition ratio [N]/([O]+[N]) in the silicon oxinitride film 12 adjacent to the floating gate electrode 13 and the silicon substrate 11 is 1% or higher, post oxidation which is performed in the oxygen gas atmosphere (the conventional method) undesirably results in a shape as shown in FIG. 15B. On the other hand, the present invention arranged such that the post oxidation is performed in the atmosphere containing the oxygen radicals causes nitrogen in the silicon oxinitride film 12 adjacent to the lower edge of the floating gate electrode 13 and a region in which the floating gate electrode has been removed to be desociated. As a result, the oxidation at the lower edge of the floating gate electrode 13 and the silicon substrate 11 proceeds considerably.

As a result, enlargement of the curvature of the lower edge of the floating gate electrode 13 and proceeding of the bird's beak oxidation of the silicon substrate 11 moderate the electric field at the lower edge of the floating gate electrode 13 and that in the source/drain region 17. Moreover, the process damage in the silicon oxinitride film 12 adjacent to the lower edge of the floating gate electrode 13 can be recovered. Thus, the resistance against insulation can be improved.

In the step shown in FIG. 3D, the post oxidation is performed by carrying out the heat treatment in the oxygen radical atmosphere. A similar effect can be obtained from heat treatment which is performed in ozone atmosphere. When the thickness of the post oxidation film obtained by the post oxidation using ozone or the oxygen radicals is insufficiently small, usual oxidation may be added after the post oxidation has been performed.

When desociation of nitrogen in the silicon oxinitride film (the tunnel insulating film) 12 adjacent to the lower edge of the floating gate electrode 13 owing to the post oxidation using ozone or the oxygen radicals is not required, a usual nitrogen introducing process, such as heat treatment in a nitriding gas atmosphere, such as nitrogen monoxide, may be added after the post oxidation to introduce nitrogen.

Figure 4B:
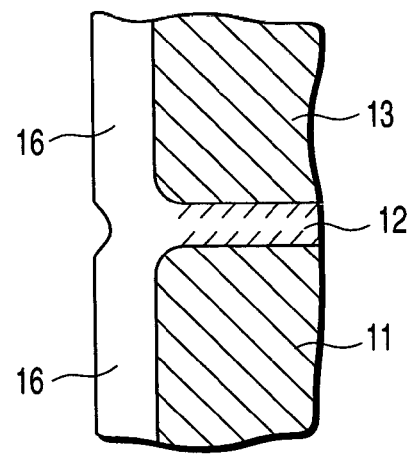

FIG. 4B is an enlarged view showing a portion adjacent to the lower edge of the floating gate electrode 13 in a case where etching reach the silicon substrate 11 when the polycrystalline silicon film 13 is patterned in the step shown in FIG. 3C. In the drawing, a diagonal-line portion indicates a region in which the concentration of nitrogen is high.

Figure 16B:
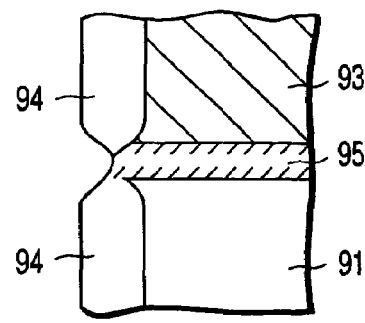

As compared with a case shown in FIG. 16B in which the post oxidation is performed in the oxygen gas atmosphere (the conventional technique), the present invention is arranged to perform the oxidation in the atmosphere containing the oxygen radicals. Therefore, nitrogen in the silicon oxinitride film (the tunnel insulating film) 12 adjacent to the interface with the substrate and the obverse side is desociated. Thus, oxidation sufficiently proceeds. As a result, the lower edge of the floating gate electrode 13 and the upper edge of the silicon substrate 11 are considerably rounded.

As a result, the electric field at the lower edge of the floating gate electrode 13 and that in the source/drain region 17 are moderated sufficiently. Moreover, the process damage in a portion adjacent to the reverse side (adjacent to the interface with the substrate) and the obverse side can be restored. As a result, resistance against insulation can be improved. Also in a case where a silicon nitride film is employed as the tunnel insulating film, a similar effect can be obtained.

THIRD EMBODIMENT

A method of manufacturing a MOS transistor according to the third embodiment will now be described. In this embodiment, a silicon nitride film is employed as the gate insulating film. Since cross sectional views showing steps of the manufacturing method according to this embodiment are the same as those according to the first embodiment, description will now be made with reference to FIGS. 1A to 1F.

As shown in FIG. 1A, a silicon nitride film 21 serving as a gate insulating film and having a thickness of 3 nm is formed on the flattened surface of a silicon substrate 1 by an LPCVD method using monosilane and ammonia as sources.

Then, an LPCVD using monosilane as a source is employed to form an undoped polycrystalline silicon film having a thickness of 150 nm on the silicon nitride film 2'. Then, boron (B) ions are, as the dopant, implanted into the undoped polycrystalline silicon film. Thus, as shown in FIG. 1B, a low-resistance polycrystalline silicon film 3 which is formed into a gate electrode is formed.

The introduction of the dopant may be performed by the thermal diffusion method. The dopant may be a donor, such as phosphorous (P) or arsenic (As). The introduction of the dopant may be performed simultaneously with the film formation or after the post oxidation (after the polycrystalline silicon film 3 has been processed).

Then, as shown in FIG. 1C, a photoresist is applied to the surface of the polycrystalline silicon film 3. Then, photograving method is employed to perform patterning so that a resist pattern 4 for forming a gate electrode is formed.

Then as shown in FIG. 1D, the resist pattern 4 is used as a mask to pattern the polycrystalline silicon film 3 by performing dry etching so that the gate electrode is formed. Then, an ashing method is employed to remove the resist pattern 4.

Then, the silicon substrate 1 is introduced into a lamp heating system oxidizing furnace. Then, while introducing mixed gas of oxygen and hydrogen (oxygen is 50%) into the furnace, heat treatment is performed at 900° C., for 10 seconds at 650 Pa. Thus, as shown in FIG. 1E, the surface (the side surfaces and the upper surface) of the gate electrode 3 and the exposed surface of the silicon nitride film (the gate insulating film) 21 are oxidized so that a post oxidation film 5 is formed. The foregoing oxidation is performed by using oxygen radicals generated due to reactions of oxygen and hydrogen.

The thickness of the post oxidation film 5 is 4 nm on the silicon substrate 1 and about 5 nm on the side wall of the gate electrode 3. It is preferable that the oxidizing temperature in the post oxidation step is a high temperature not lower than 900° C. to improve the desociating efficiency of nitrogen in the silicon oxinitride film 2, enlarge the radius of curvature of the lower edge of the gate electrode 3 and quickly recover the defect of the silicon nitride film 2'.

It is preferable that the oxidizing pressure is a low pressure of 1 kPa or lower to prevent deactivation of ozone in the atmosphere owing to the reactions between oxygen and hydrogen. Note that the post oxidation may be performed after the source/drain region 6 has been formed.

Finally, as shown in FIG. 1F, the gate electrode 3 is used as a mask to introduce the dopant ions into the surface of the substrate. Then, a lamp annealing method is employed to activate the dopant so that the source/drain region 6 is formed in a self-aligning manner. Then, a conventional method is employed to form an interlayer insulating film and metal wirings (not shown) so that the MOS transistor is manufactured.

Figure 5A:
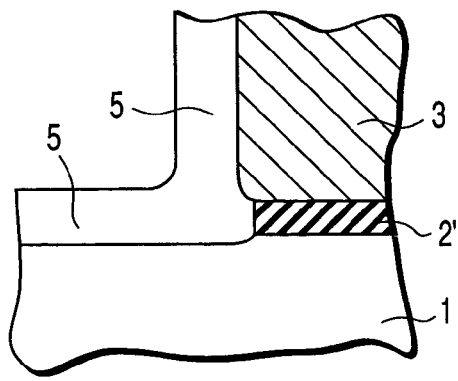
FIGS. 5A to 5E are enlarged views showing a portion adjacent to the lower edge of the gate electrode formed by a method of manufacturing a MOS transistor according to a third embodiment of the present invention and a modification thereof.

FIG. 5A is an enlarged view showing a portion adjacent to the lower edge of the gate electrode 3 formed by the method according to this embodiment. In the drawing, a diagonal-line portion shows a region in which the concentration of nitrogen is high. In the present invention, the post oxidation is performed in the atmosphere containing the oxygen radicals. Therefore, nitrogen is desociated in a portion adjacent to the lower edge of the gate electrode 3 and that in the region from which gate electrode has been removed in the gate insulating film (the silicon nitride film) 2. As a result, the oxidation reaction proceeds so that conversion to the silicon oxide film is performed.

Then, oxidation of the gate insulating film (the silicon nitride film) 2' is continued so that the finished shape of the lower portion of the gate electrode 3 is such that the bird's beaks are formed considerably as compared with the shape (the shape shown in FIG. 15C) formed in the case where the post oxidation has been performed in the oxygen gas atmosphere.

As a result, the shape of the lower edge of the gate electrode 3 can sufficiently be rounded.

Moreover, the distance from the lower edge of the gate electrode 3 to the source/drain region 6 can be elongated. Hence it follows that the electric field at the lower edge of the gate electrode 3 and that in the source/drain region 6 can be moderated. As a result, the resistance of the device against insulation can be improved.

Figure 5B:
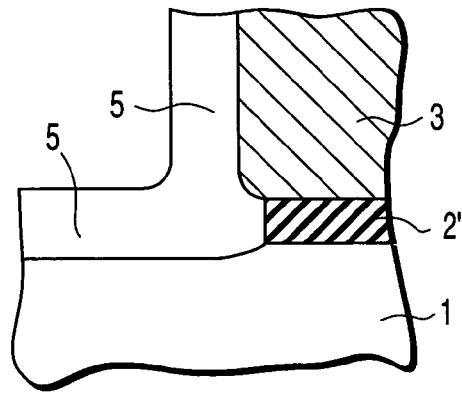
Figure 5C:
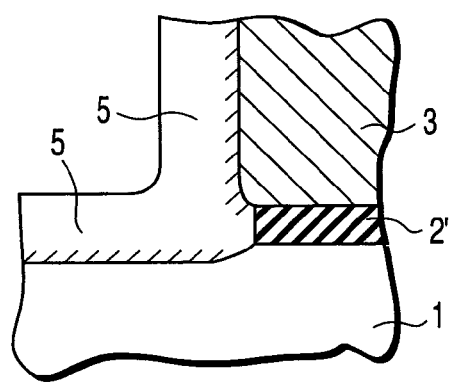

In the step shown in FIG. 1E, the oxygen radicals for use in the post oxidation step is generated due to the reactions between oxygen and hydrogen. Another generating method may be employed. When the heat treatment is performed in an ozone atmosphere, a similar effect can be obtained. When the thickness of the post oxidation film obtained due to the post oxidation step using ozone or the oxygen radicals is insufficiently small, a usual oxidation may be added after the post oxidation step. Thus, a post oxidation film 5 having a required thickness can be obtained, as shown in FIG. 5B.

When desociation of nitrogen in the silicon nitride film (the gate insulating film) 2' adjacent to the lower edge of the gate electrode 3 owing to the post oxidation is not required, a usual nitrogen introduction process, such as heat treatment in a nitriding gas atmosphere, such as nitrogen monoxide, is added to be performed after the post oxidation. Thus, nitrogen can be introduced into the silicon nitride film (the gate insulating film) 2' adjacent to the lower edge of the gate electrode 3.

Figure 5D:
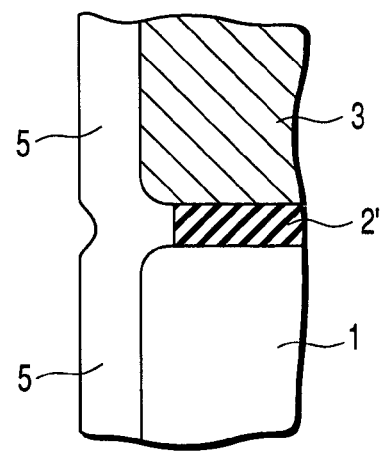

FIG. 5D is an enlarged view showing a portion adjacent to the lower edge of the gate electrode 3 in a case where etching reaches the silicon substrate 1 when the polycrystalline silicon film 3 is patterned in the step shown in FIG. 1D. In the drawing, a diagonal-line portion indicates a region in which the concentration of nitrogen is high.

Figure 16C:
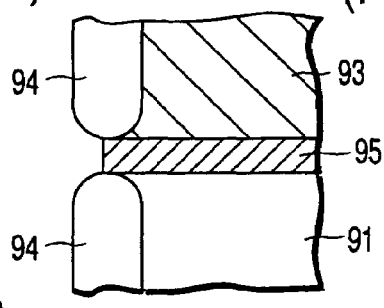
Figure 17:
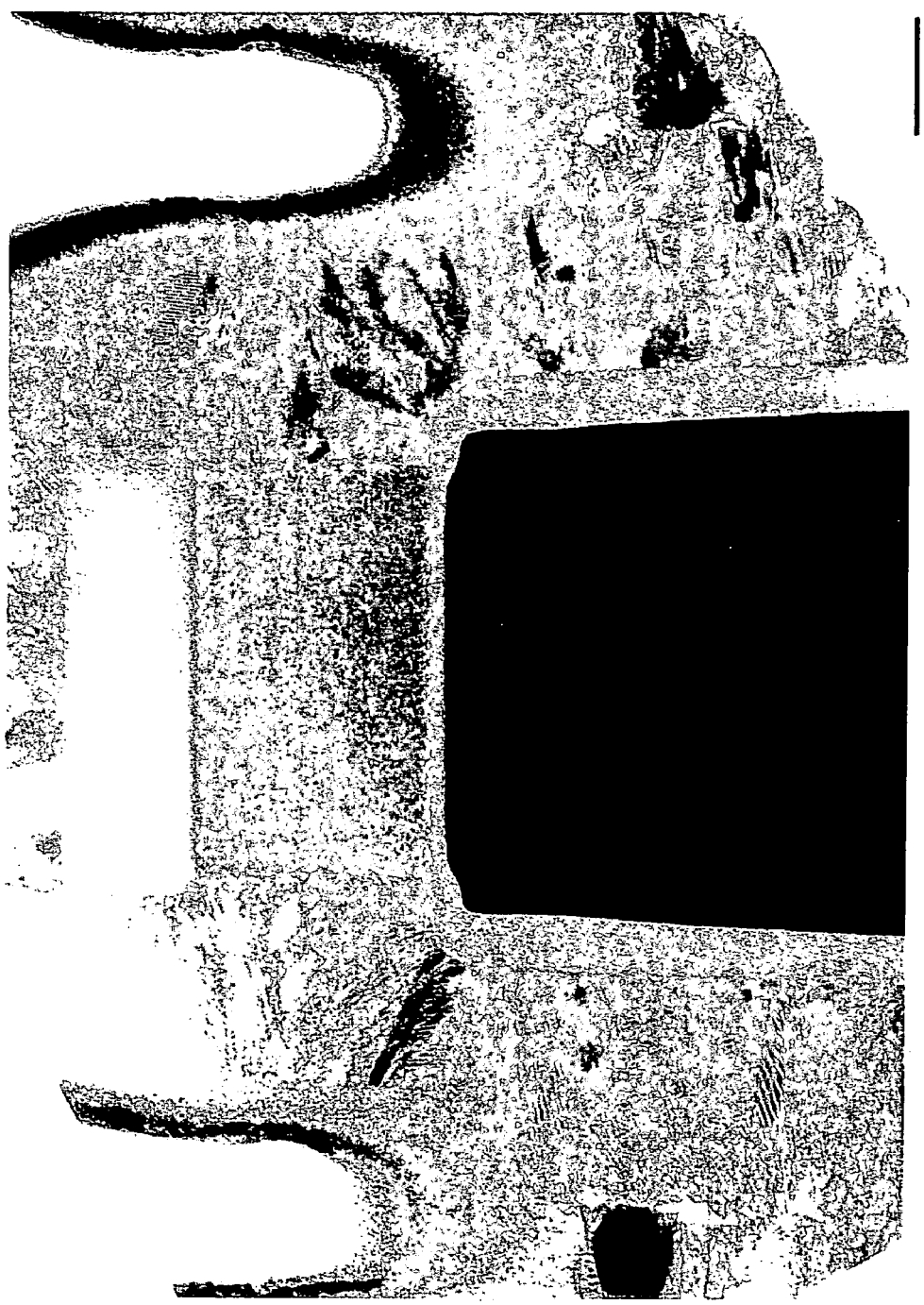
FIG. 17 is a microscopic photograph of a semiconductor structure containing a silicon nitride film oxidized by the oxidizing method according to the present invention.
Figure 18:
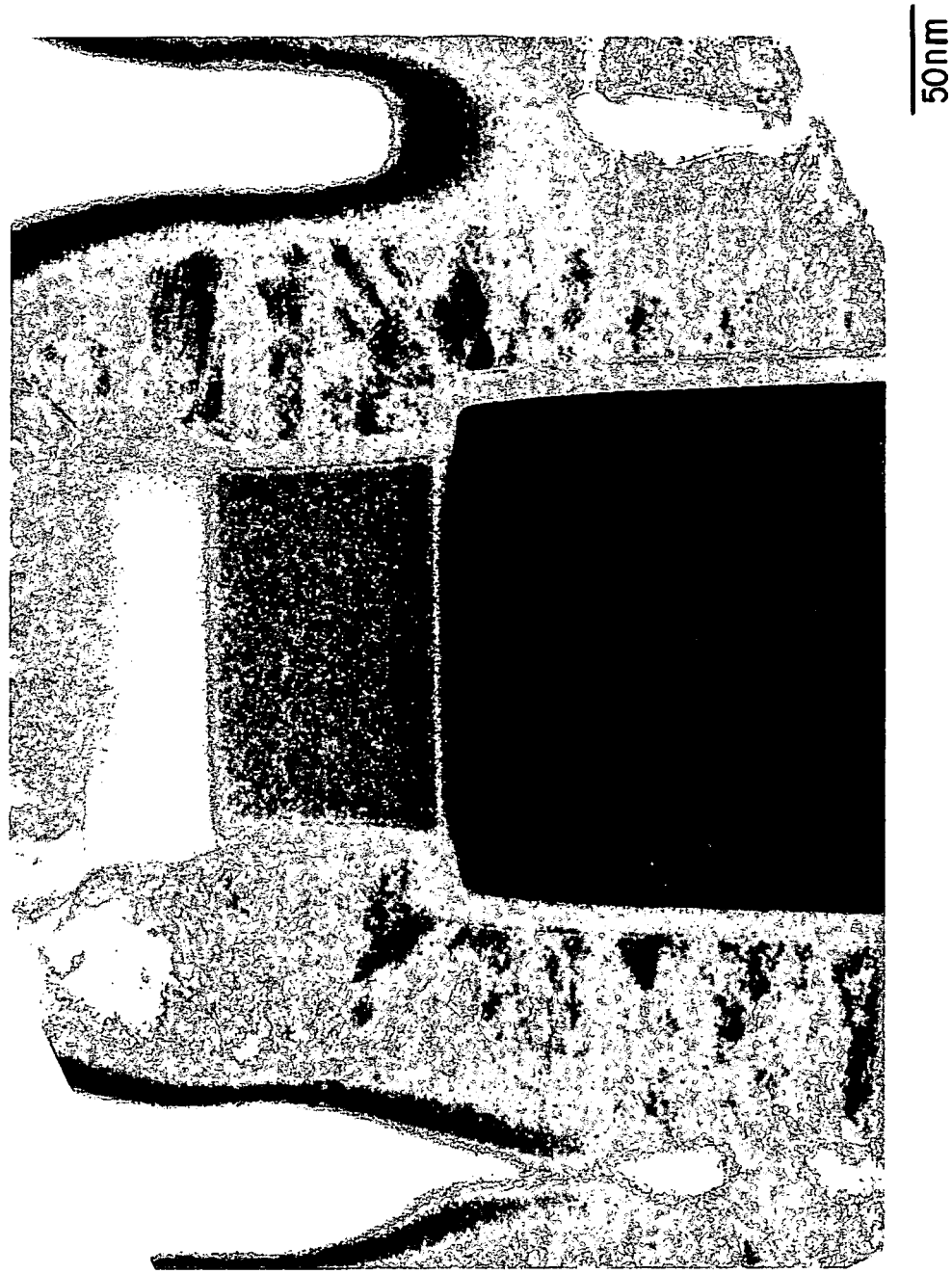
FIG. 18 is a microscopic photograph of a semiconductor structure containing a silicon nitride film oxidized by the conventional oxidizing method.

As compared with the conventional technique with which the post oxidation (FIG. 16C) is performed in the oxygen gas atmosphere, the present invention is arranged to perform the post oxidation in the atmosphere containing the oxygen radicals. Therefore, nitrogen in the silicon nitride film (the gate insulating film) 21 is desociated. Thus, oxidation sufficiently proceeds. Therefore, the upper edge of the silicon substrate 1 and the lower edge of the gate electrode 3 are sufficiently rounded. As a result, the electric field at the lower edge of the gate electrode 3 and that in the source/drain region 6 can be moderated. Thus, the resistance of the device against insulation can be improved.

Figure 5E:
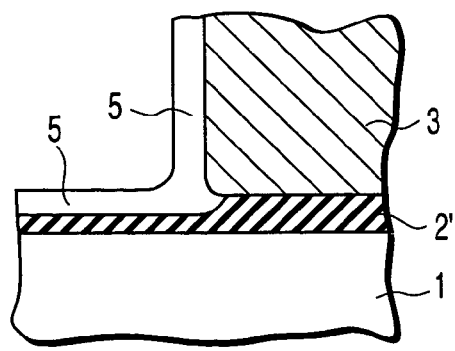

In this embodiment, the silicon nitride film (the gate insulating film) 2' exposed owing to dry etching is completely oxidized. Then, oxidation is continued. When only the surface of the exposed portion of the silicon nitride film (the gate insulating film) 21 is converted into the oxide film as shown in FIG. 5E, a similar effect can be obtained.

As compared with the conventional technique with which the post oxidation is performed in the oxygen gas atmosphere (FIG. 15C), the present invention enables the shape of the lower edge of the gate electrode 3 to sufficiently be rounded as the oxidation proceeds. Thus, the electric field at the lower edge of the gate electrode 3 and that in the source/drain region 6 can be relaxed. As a result, the resistance of the device against insulation can be improved.

The silicon nitride film (the gate insulating film) 2' according to this embodiment is formed by the LPCVD method using monosilane and ammonia as the sources. Another method may be employed which is, for example, a plasma nitriding method or a JVD (Jet Vapor Deposition) method to obtain a similar effect. Another element except for silicon and nitrogen may be contained in the silicon nitride film (the gate insulating film) 2'. When a film mainly composed of silicon and nitrogen is used, a similar effect can be obtained.

FOURTH EMBODIMENT

FIGS. 6A to 6H are cross sectional views showing steps of a method of manufacturing a MOS transistor according to a fourth embodiment of the present invention. In this embodiment, a method of manufacturing a MOS transistor having a small size exceeding the performance of lithography will now be described.

Figure 6A:
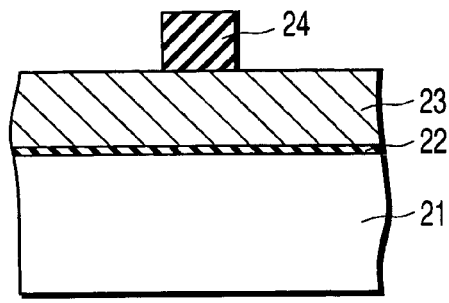
FIGS. 6A to 6G are cross sectional views showing steps of a method of manufacturing a MOS transistor according to a fourth embodiment of the present invention.

As shown in FIG. 6A, a silicon oxinitride film 22 serving as a gate insulating film and having a thickness of 5 nm is, by a conventional thermal oxidation/thermal nitriding method, formed on the surface of the silicon substrate 21 to which channel doping has been performed to control the threshold value of the MOS transistor. The channel doping step is performed by introducing boron ions as the dopant to the surface of the substrate by the ion implanting method under condition of 50 keV and $3\times10^{19}$ cm$^{-2}$. Then, annealing for activating the dopant is performed at 1050° C. for 20 seconds.

Then, as shown in FIG. 6A, a polycrystalline silicon film 23 serving as the gate electrode and having a thickness of 150 nm is deposited on the silicon oxinitride film 22 by a CVD method. Then, a silicon nitride film having a thickness of 100 nm and serving as a SiN pattern 24 which is used as a mask when the polycrystalline silicon film 23 is etched is deposited on the polycrystalline silicon film 23 by the CVD method.

Then, as shown in FIG. 6A, the lithography technique is used to form a gate resist pattern (not shown) having a minimum width (100 nm) on the silicon nitride film so as to be used as a mask to etch the silicon nitride film by a RIE method. Thus, the SiN pattern 24 is formed.

Figure 6B:
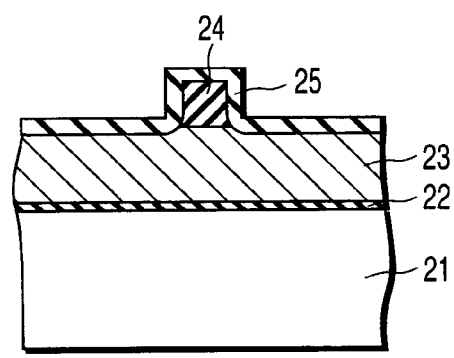

Then, the gate resist pattern is removed, and then the silicon substrate 21 is introduced into a vertical batch oxidizing furnace. While introducing mixed gas of ozone and oxygen (ozone is 10%) into the furnace, an oxidation process is performed at 850° C. for 2 hours at 100 Pa. Thus, as shown in FIG. 6B, a silicon oxide film 25 having a thickness of 10 nm is formed on the exposed surface of the SiN pattern 24. At this time, the silicon oxide film 25 is as well as formed on the exposed surface of the polycrystalline silicon film 23.

The oxidizing reaction of the silicon nitride film proceeds while nitrogen in the film is being desociated. Therefore, the position of the surface of the SiN pattern 24 and that of the silicon oxide film 25 are substantially the same. As a result, the width of the SiN pattern 24 is 80 nm in the upper portion. As a result, the SiN pattern 24 having a small size exceeding the performance of the lithography can be obtained. Note that the lower portion of the SiN pattern 24 encounters reduction in the oxidizing rate due to insufficient supply of the oxidizer. Therefore, the width of the lower portion of the SiN pattern 24 is 85 nm.

Figure 6C:
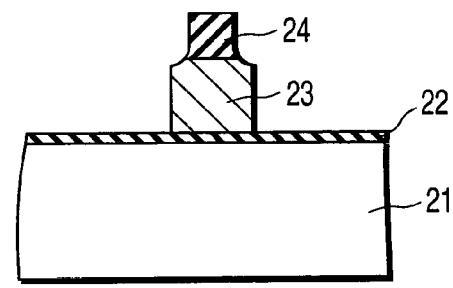

Then, as shown in FIG. 6C, the silicon oxide film 25 is removed by diluted hydrofluoric acid solution. Then, the SiN pattern 24 is used as a mask to etch the polycrystalline silicon film 23 by the RIE method. Thus, a gate electrode 23 having a width of 85 nm is formed. Then, the SiN pattern 24 is removed by phosphoric acid solution. At this time, also the exposed portion of the silicon oxinitride film (the gate insulating film) 22 is removed.

Figure 6D:
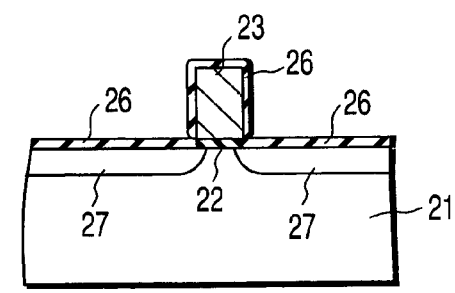

Then, as shown in FIG. 6D, thermal oxidation is performed at 850° C. to form a post oxidation film 26 having a thickness of 5 nm on the silicon substrate 21, the silicon oxinitride film 22 and the exposed surface of the gate electrode 23.

Then, as shown in FIG. 6D, the gate electrode 23 is used as a mask to introduce arsenic ions serving as the dopant into the surface of the substrate through the post oxidation film 26 by the ion implanting method at 10 keV and $5\times10^{14}$ cm$^{-2}$. Then, annealing is performed to activate the dopant at, for example, 800° C. for 10 seconds. Thus, an extension region (a shallow diffusion region in which the concentration of impurities is low) 27 is formed in a self-aligning manner. In this embodiment, introduction of the dopant is performed after the polycrystalline silicon film 23 has been processed. The introduction may be performed simultaneously with the film formation or before the polycrystalline silicon film 23 is processed.

Figure 6E:
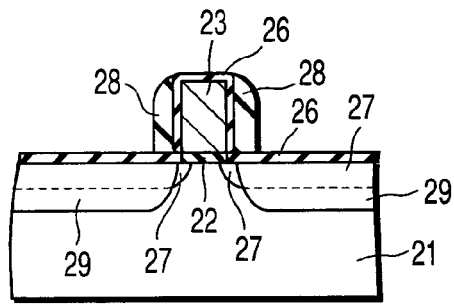

Then, as shown in FIG. 6E, a silicon nitride film having a thickness of 50 nm and serving as a side wall spacer 28 is deposited on the overall surface by the CVD method. Then, the silicon nitride film is etched by the conventional etch back RIE method. Then, the side wall spacer 28 is formed on the side wall of the gate electrode portion. The thickness of the finished side wall spacer 28 is about 50 nm.

Then, as shown in FIG. 6E, the ion implanting method is performed at 60 kev and $5\times10^{15}$ cm$^{-2}$ so that arsenic ions serving as the dopant are introduced into the surface of the substrate and the gate electrode 23. Then, annealing is performed to activate the dopant at 1000° C. for 10 seconds.

Thus, the resistance of the gate electrode 23 is lowered. Moreover, a source/drain region (a deep diffusion region in which the concentration of impurities is high) 29 is formed.

Figure 6F:
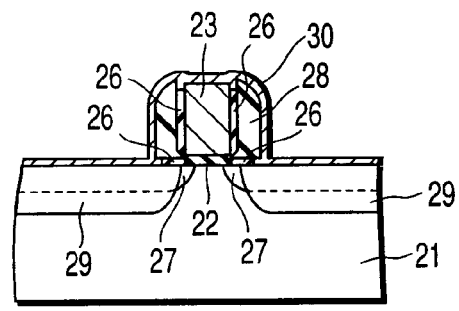

Then, as shown in FIG. 6F, the exposed post oxidation film 26 is removed by using diluted hydrofluoric acid solution. Then, a cobalt film 30 having a thickness of 10 nm is formed on the overall surface by a sputtering method.

Figure 6G:
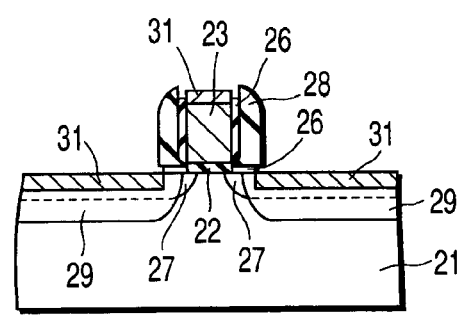

Then, as shown in FIG. 6G, annealing is sequentially performed at 500° C. for 60 seconds and at 770° C. for 30 seconds (two-step annealing). Thus, a cobalt silicide film 31 is formed on the upper surface of the gate electrode 23 and the source/drain region 29. Then, a non-reacted portion of the cobalt film 30 is removed.

Then, a conventional technique is employed to form an interlayer insulating film and electric wirings. Thus, a small-size MOS transistor having a gate electrode width of 85 nm is manufactured.

In this embodiment, the SiN pattern 24 composed of the silicon nitride film which permits an etching selection ratio with respect to the polycrystalline silicon film 23 is employed as the mask when the polycrystalline silicon film 23 is etched. Therefore, the aspect ratio of the SiN pattern 24 is not raised. Hence it follows that dispersion of the finished shape of the gate electrode 23 can considerably be prevented. Moreover, the problem of falling of the SiN pattern 24 can be prevented.

Since the oxidation of the SiN pattern 24 is performed in the ozone atmosphere, the thermal budget can considerably be reduced. As a result, the problem of change in the concentration profile of boron in the silicon substrate 21 can be prevented.

As distinct from the plasma oxidation, the oxidation in the ozone atmosphere enables the silicon oxinitride film (the gate oxinitride film) 22 to be free from any plasma damage. Therefore, deterioration in the reliability of the silicon oxinitride film 22 and change in the characteristics of the MOS transistor can be prevented.

The foregoing effects can be obtained also in a case where the oxidation is performed in the oxygen radical atmosphere as well as the oxidation in the ozone atmosphere. When change in the characteristics of the MOS transistor owing to the plasma damage is permitted, the plasma oxidation method in the oxygen or ozone atmosphere may simultaneously be employed.

FIFTH EMBODIMENT

The manufacturing method according to the fourth embodiment has the step for oxidizing the film which is formed into the gate electrode. Therefore, the foregoing manufacturing method cannot be applied to a case where a conductive film, such as a tungsten film, which causes an abnormal oxidation is employed as the overall body or a portion of the gate electrode. In this embodiment, a method of manufacturing a small-size MOS transistor will now be described in a case that the foregoing conductive film is employed.

Figure 7A:
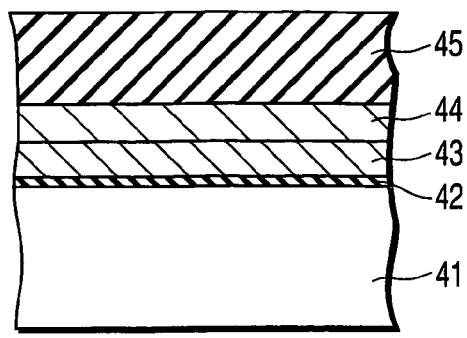
FIGS. 7A to 7E are cross sectional views showing steps of a method of manufacturing a MOS transistor according to a fifth embodiment of the present invention.

As shown in FIG. 7A, a silicon nitride film 42 serving as a gate insulating film and having a thickness of 5 nm is, by a conventional CVD method, formed on the surface of a silicon substrate 41 subjected to the channel doping similarly to the fourth embodiment to control the threshold value of the MOS transistor.

Then, as shown in FIG. 7A, a polycrystalline silicon film 43 which is formed into the gate electrode and having a thickness of 100 nm is formed on the silicon nitride film 42 by the CVD method. Then, a tungsten film 44 having a thickness of 100 nm is formed by the sputtering method. Then, a silicon nitride film 45 having a thickness of 150 nm and serving as a SiN pattern when the polycrystalline silicon film 43 and the tungsten film 44 are etched is formed by the CVD method. The introduction of the dopant for reducing the resistance of the polycrystalline silicon film 43 may be performed simultaneously with formation of the polycrystalline silicon film 43, after the polycrystalline silicon film 43 has been formed and before the polycrystalline silicon film 43 is processed or after the post oxidation (after the polycrystalline silicon film 43 has been processed) has been performed.

Figure 7B:
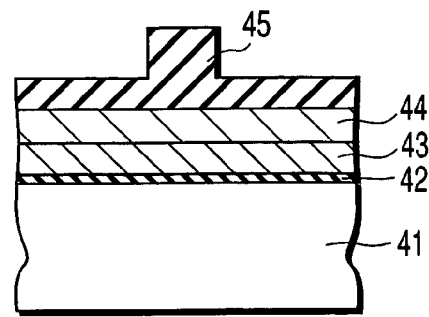

Then, as shown in FIG. 7B, the lithography technique is employed to form a gate resist pattern (not shown) having a minimum width (100 nm) so as to be used as a mask to etch the surface of the silicon nitride film 45 by only a thickness of 100 nm by the RIE method. As a result, the thickness of the silicon nitride film 45 in a region which is not covered with the gate resist pattern is 50 nm. Then, the gate resist pattern is removed, and then the silicon substrate 41 is introduced into a remote plasma oxidizing furnace.

Figure 7C:
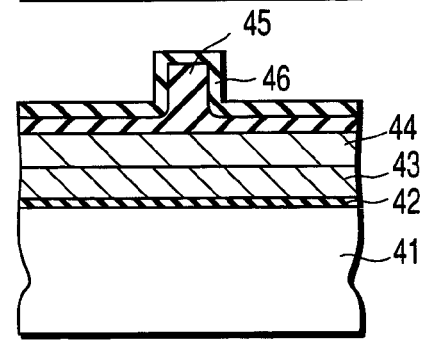

Then, while introducing oxygen radicals into the remote plasma oxidizing furnace, heat treatment is performed at 900° C. for 10 minutes at 100 Pa. Thus, as shown in FIG. 7C, a silicon oxide film 46 having a thickness of 10 nm is formed on the exposed surface of the silicon nitride film 45.

The oxidizing reaction of the silicon nitride film proceeds such that nitrogen is desociated. Therefore, the position of the surface of the silicon nitride film 45 and that of the silicon oxide film 46 are substantially the same. As a result, the width of the silicon nitride film 45 realized after the silicon oxide film 46 has been formed is 80 nm in the upper portion. Thus, a gate electrode pattern having a small size exceeding the performance of the lithography can be obtained. The thickness of the silicon nitride film 45 in the region except for the gate electrode pattern is 40 nm.

Figure 7D:
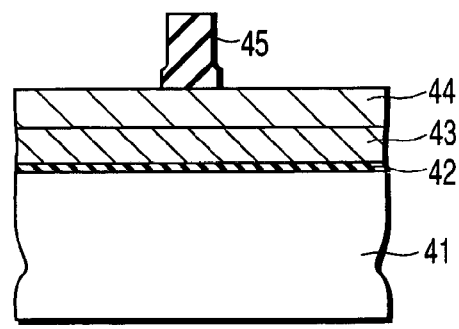

Then, as shown in FIG. 7D, the silicon oxide film 46 is removed by the diluted hydrofuroric acid solution. Then, the overall surface of the silicon nitride film 45 is etched by the RIE method to remove the silicon nitride film 45 in the region except for the gate electrode pattern. Thus, a SiN pattern is formed. The width of the lower portion of the residual silicon oxide film 46 is 85 nm.

Figure 7E:
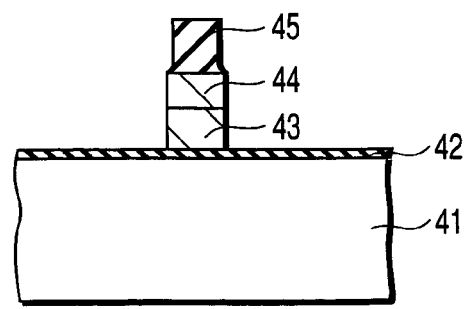

Then, as shown in FIG. 7E, the SiN pattern 45 is used as a mask to sequentially etch the tungsten film 44 and the polycrystalline silicon film 43 by the RIE method. Thus, a gate electrode having a polycide structure composed of a laminated film of the polycrystalline silicon film 43 and the tungsten film 44 and having a width of 85 nm is formed.

Then, a method similar to that according to the fourth embodiment is employed to form the post oxidation film, the side wall spacer, the extension region and the source/drain region. Thus, the small-size MOS transistor having the polycide structure incorporating the tungsten film which is the metal film and having the gate electrode width of 85 nm can be manufactured.

According to this embodiment, the tungsten film 44 is covered with the silicon nitride film 45 in the step (FIG. 7C) for oxidizing the silicon nitride film 45 for forming the fine SiN pattern. Therefore, occurrence of abnormal oxidation can be prevented. Moreover, a fact that the MOS transistor according to the present invention has a similar effect to that according to the fourth embodiment has been confirmed.

SIXTH EMBODIMENT

The manufacturing methods according to the fourth and fifth embodiments have the structure that the gate electrode having a width larger than the minimum width of the SiN pattern is formed owing to the shape of the SiN pattern. In this embodiment, a method of manufacturing a small-size MOS transistor exceeding the performance of the lithography and overcoming the foregoing problem will now be described.

Figure 8A:
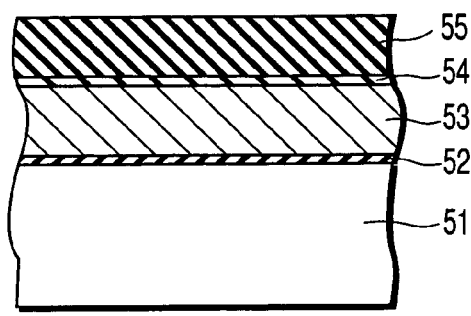
FIGS. 8A to 8G are cross sectional views showing steps of a method of manufacturing a MOS transistor according to a sixth embodiment of the present invention.

As shown in FIG. 8A, a silicon oxinitride film 52 serving as a gate insulating film and having a thickness of 5 nm and a polycrystalline silicon film 53 serving as a gate electrode and having a thickness of 150 nm are, by the conventional CVD method, formed on the surface of a silicon substrate 51 subjected to channel doping to control the threshold value of the MOS transistor.

The channel doping step is performed such that boron ions serving as the dopant are introduced into the surface of the substrate by the ion implanting method at 150 keV and $3\times10^{19}$ cm$^{-2}$. Then, annealing is performed to activate the dopant at 1050° C. for 20 seconds. The introduction of the dopant to reduce the resistance of the polycrystalline silicon film 53 may be performed simultaneously with formation of the polycrystalline silicon film 53, after the polycrystalline silicon film 53 has been formed and before the polycrystalline silicon film 53 is processed or after the post oxidation (after the polycrystalline silicon film 53 has been processed) has been performed.

Then, as shown in FIG. 8A, a silicon oxide film 54 having a thickness of 5 nm is formed on the surface of the polycrystalline silicon film 53 by the thermal oxidation method. Then, a silicon nitride film 55 having a thickness of 100 nm is formed on the silicon oxide film 54 by the CVD method. The silicon oxide film 54 and the silicon nitride film 55 are formed into a SiO$_2$ pattern and a SiN pattern serving as masks when the polycrystalline silicon film 53 is etched.

Figure 8B:
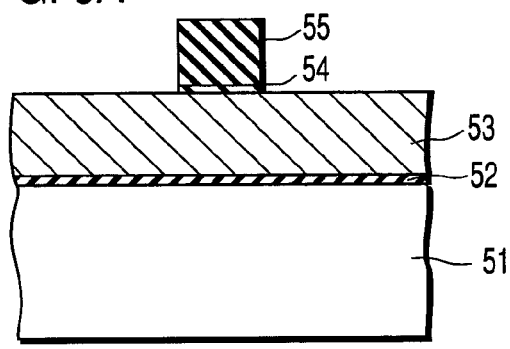

Then, as shown in FIG. 8B, the lithography technique is employed to form a gate resist pattern (not shown) having a minimum width (100 nm) so as to be used as a mask so as to sequentially etch the silicon nitride film 55 and the silicon oxide film 54 by the RIE method. Thus, the SiO$_2$ pattern and the SiN pattern are formed. Then, the gate resist pattern is removed, and then the silicon substrate 51 is introduced into the vertical batch oxidizing furnace.

Figure 8C:
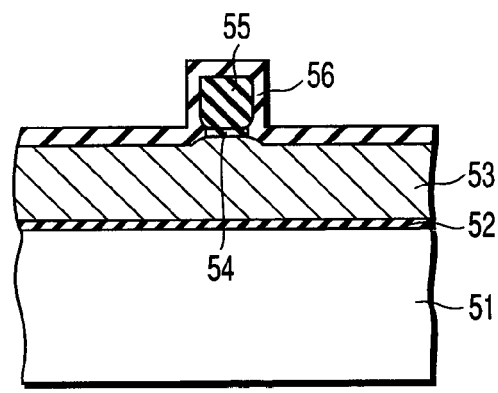

Then, while introducing mixed gas of ozone and oxygen (ozone is 10%) into the vertical batch oxidizing furnace, heat treatment is processed at 850° C. for 2 hours at 100 Pa. Thus, as shown in FIG. 8C, a silicon oxide film 56 having a thickness of 10 nm is formed on the exposed surfaces of the SiO$_2$ pattern mask 54 and the SiN pattern mask 55. At this time, the silicon oxide film 56 is formed also on the exposed surface of the polycrystalline silicon film 53.

The oxidizing reaction of the silicon nitride film proceeds such that nitrogen is desociate. Therefore, the position of the surface of the SiN pattern 55 and that of the silicon oxide film 56 are substantially the same. As a result, the width of the SiN pattern 55 is 80 nm. Thus, the SiN pattern 55 having a small size exceeding the performance of the lithography can be obtained. Moreover, the lower portion of the SiN pattern 55 is formed by the SiO$_2$ pattern 55 composed of the silicon oxide film exhibiting a high diffusion rate of the oxidizer. Therefore, the lower portion is formed into a rounded shape.

Figure 8D:
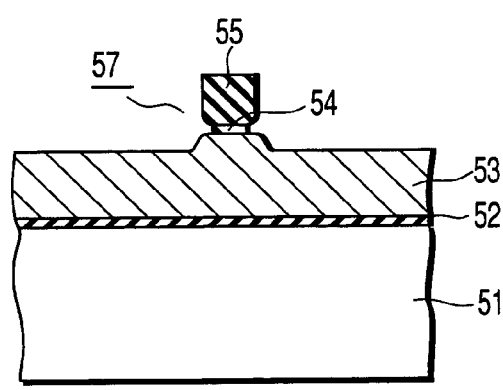

Then, as shown in FIG. 8D, the silicon oxide film 56 is removed by diluted hydrofluoric acid solution. At this time, also the SiO$_2$ pattern 54 is slightly removed. Thus, shoulder portions 57 are formed in the polycrystalline silicon film 53.

Figure 8E:
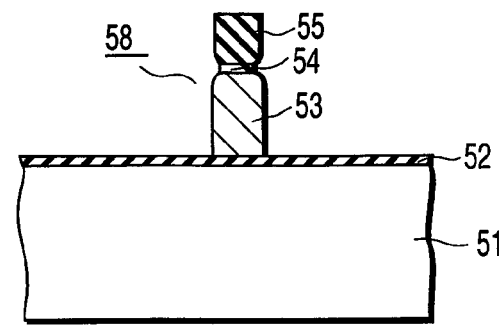

Then, as shown in FIG. 8E, the patterns 54 and 55 are used as masks to etch the polycrystalline silicon film 53 by the RIE method so that the gate electrode 53 having a width of 80 nm is formed. At this time, an influence of the shoulder portions 57 provided for the polycrystalline silicon film 53 causes upper edges 58 of the gate electrode 53 to be rounded.

Figure 8F:
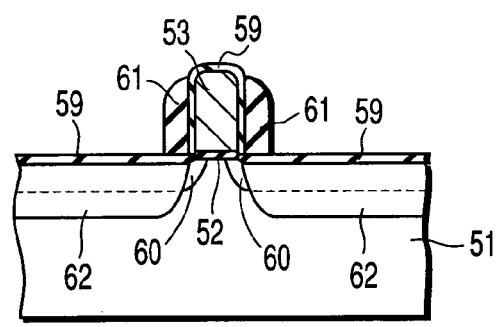

Then, as shown in FIG. 8F, the exposed portion of the SiN pattern film 55 and the gate oxinitride film 52 and the overall body of the silicon oxide film 54 are removed by phosphoric acid solution. Then, thermal oxidation is performed at 850° C. so that a post oxidation film 59 having a thickness of 5 nm is formed on the exposed surface of the silicon substrate 51 and the gate electrode 53.

Then, as shown in FIG. 8F, the ion implanting method is performed at 5 keV and $5\times10^{14}$ cm$^{-2}$ to introduce boron fluoride ions serving as the dopant into the surface of the substrate through the post oxidation film 59. Then, annealing is performed at, for example, 800° C. for 10 seconds, to activate the dopant. Thus, an extension region 60 is formed.

Then, as shown in FIG. 8F, a silicon nitride film serving as a side wall spacer 61 and having a thickness of 50 nm is deposited on the overall surface by the CVD method. Then, the silicon nitride film is etched by a conventional etch back RIE method to form the side wall spacer 61. The thickness of the finished side wall spacer 61 is about 50 nm.

Then, as shown in FIG. 8F, arsenic ions serving as the dopant is introduced into the surface of the substrate and the gate electrode 53 by the ion implanting method at 60 keV and $5\times10^{15}$ cm$^{-2}$. Then, annealing is performed at, for example, 1000° C. for 10 seconds, to activate the dopant to lower the resistance of the gate electrode 53. Moreover, a source/drain region 62 is formed.

Figure 8G:
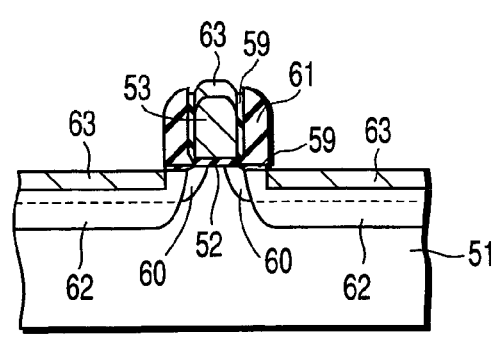

Then, as shown in FIG. 8G, the exposed post oxidation film 59 is removed by the diluted hydrofluoric acid solution. Then, a cobalt film (not shown) having a thickness of 10 nm is formed on the overall surface by the sputtering method. Then, annealing is sequentially performed at 500° C. for 60 seconds and at 770° C. for 30 second (two-step annealing) so that a cobalt silicide film 63 is formed on the gate electrode 53 and the source/drain region 62. Then, a non-reacted cobalt film is removed. The cobalt silicide film 63 formed on the upper portion of the gate electrode 53 has a large surface area as a reflection of the rounded shape of the upper edge of the gate electrode 53.

Then, a conventional technique is employed to form the interlayer insulating film and wirings. Thus, a MOS transistor having a gate electrode width of 85 nm is manufactured.

In this embodiment, the mask for processing the gate electrode is a laminated film of the silicon oxide film 54 (the lower portion)/the silicon nitride film 55 (the upper portion). The silicon oxide film 54 exhibits high diffusion rate of the oxidizer as compared with the silicon nitride film 55. Therefore, enlargement of the lower portion of the mask for processing the gate electrode occurring in the oxidizing step (FIG. 8C) for forming the mask for processing the fine gate electrode can be prevented. As a result, a MOS transistor incorporating the fine gate electrode similar to the minimum size of the mask can be formed.

Since the cobalt silicide film 63 formed on the gate electrode 53 has a large surface area, the resistance of the gate electrode 53 can effectively be lowered. Thus, a high-speed operation of the MOS transistor can be realized. Moreover, a fact has been confirmed that the MOS transistor according to this embodiment attains a similar effect obtainable from the fourth embodiment.

SEVENTH EMBODIMENT

FIGS. 9A to 9G are cross sectional views showing steps of a method of manufacturing a nonvolatile memory cell according to a seventh embodiment of the present invention. The drawings show cross sections in a direction perpendicular to the direction of the channel.

Figure 9A:
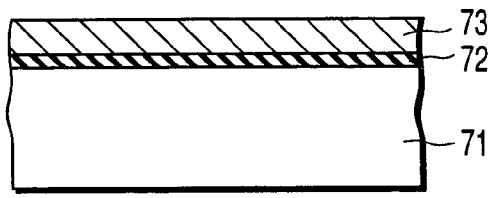
FIGS. 9A to 9G are cross sectional views showing steps of a method of manufacturing a nonvolatile memory cell according to a seventh embodiment of the present invention.

As shown in FIG. 9A, a silicon oxinitride film 72 serving as a tunnel insulating film and having a thickness of 10 nm is, by a conventional thermal oxidation/thermal nitriding method, formed on the surface of a silicon substrate 71 to which boron has been doped to control the threshold value of the transistor. Then, a polycrystalline silicon film 73 serving as a lower layer of the floating gate electrode and having a thickness of 50 nm is formed on the silicon oxinitride film 72 by the CVD method.

Figure 9B:
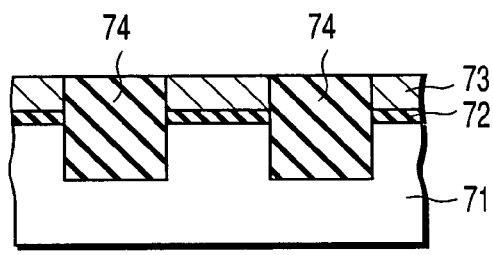

Then, as shown in FIG. 9B, the lithography technique is employed to form a trench resist pattern (not shown) having a small width and intervals (100 nm) on the polycrystalline silicon film 73 so as to be used as a mask to etch the polycrystalline silicon film 73, the silicon oxinitride film 72 and the silicon substrate 71 by the RIE method. Thus, a trench for isolating the device and having a depth of 200 nm is formed. Then, the foregoing trench resist pattern is removed. Then, the trench is filled with a silicon oxide film 74 serving as a device isolating insulating film.

The foregoing step for filling the trench is performed by depositing the silicon oxide film 74 by the CVD method and by removing unnecessary silicon oxide film 74 on the outside of the trench by a CMP (Chemical Mechanical Polishing process) method. Since the unnecessary silicon oxide film 74 is removed by the CMP method, flattening of the surface can substantially and easily be performed.

Figure 9C:
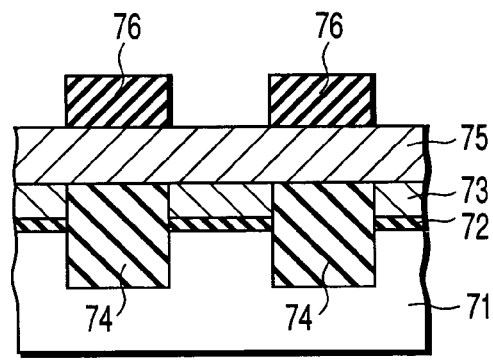

Then, as shown in FIG. 9C, a phosphorus-doped polycrystalline silicon film 75 which is formed into the upper layer of the floating gate electrode and having a thickness of 80 nm is deposited on the overall surface by the CVD method. Then, a pattern (hereinafter called a "SiN pattern") 76 composed of a silicon nitride film having a thickness of 80 nm and formed into a shape obtained by inverting the pattern of the gate electrode is formed on the phosphorus-doped polycrystalline silicon film 75. Then, the silicon substrate 71 is introduced into a vertical batch oxidizing furnace.

The SiN pattern 76 is formed by forming a gate resist pattern (not shown) having minimum width and intervals (100 nm) on the silicon nitride film and by etching the silicon nitride film by the RIE method such that the gate resist pattern is used as a mask. The silicon nitride film is formed by the CVD method.

Figure 9D:
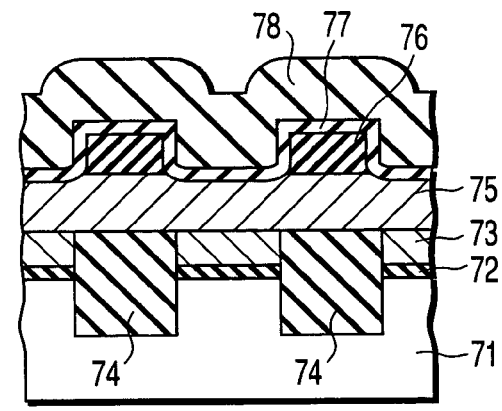

While introducing mixed gas of ozone and oxygen (ozone is 10%) into the vertical batch oxidizing furnace, heat treatment is performed at 850° C. for 2 hours at 100 Pa. Thus, as shown in FIG. 9D, a silicon oxide film 77 having a thickness of 10 nm is, by the thermal oxidation method, formed on the exposed surface of the SiN pattern 76 and that of the phosphorus-doped polycrystalline silicon film 75. The silicon oxide film 77 serves as a mask when the phosphorus-doped polycrystalline silicon film 75 is etched.

Then, as shown in FIG. 9D, a silicon oxide film 78 having a thickness of 150 nm is deposited on the overall surface by the CVD method. Thus, gaps in the SiN pattern 76 is filled. Also the silicon oxide film 78 serves as a mask when the phosphorus-doped polycrystalline silicon film 75 is etched.

Figure 9E:
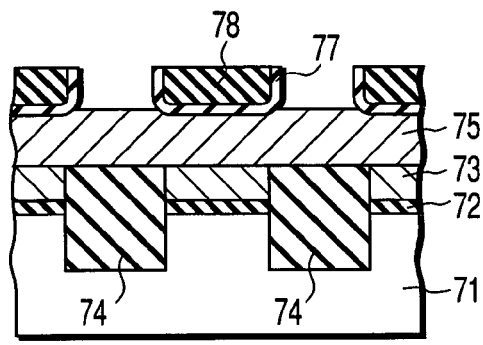

Then, as shown in FIG. 9E, the SiN pattern 76 is used as a CMP stopper to polish the silicon oxide films 77 and 78 by the CMP method until the surface of the SiN pattern 76 is exposed to flatten the surface. Then, phosphoric acid solution is used to remove the SiN pattern 76 so that a SiO$_2$ pattern (a mask for processing the gate electrode) composed of the silicon oxide films 77 and 78 and having a width of 120 nm is formed.

Figure 9F:
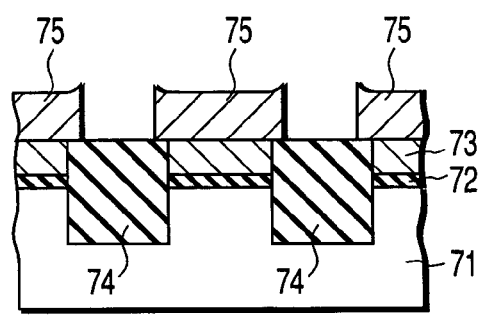

Then, as shown in FIG. 9F, the SiO$_2$ patterns 77 and 78 are used as masks to etch the phosphorus-doped polycrystalline silicon film 75 by the RIE method so that the upper layer of the floating gate electrode having a width of 120 nm is formed. At this time, the intervals of adjacent floating gate electrodes are 80 nm which is narrower than the limit width of 100 nm for the lithography. Then, the SiO$_2$ patterns 77 and 78 are removed by the diluted hydrofluoric acid solution.

Figure 9G:
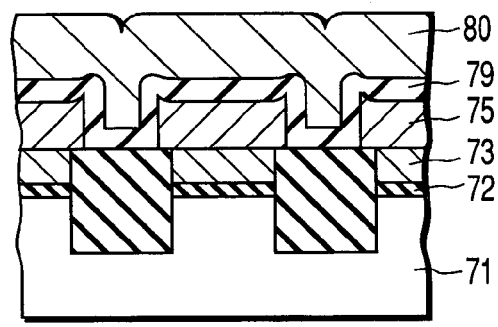

Then, as shown in FIG. 9G, an insulating film 79 between electrodes having a thickness of 15 nm is, by the conventional CVD method, deposited on the overall surface to cover the exposed surface of the upper layer 75 of the floating gate electrode. Then, a phosphorus-doped polycrystalline silicon film 80 serving as a control gate electrode and having a thickness of 100 nm is deposited on the insulating film 79 between electrodes by the conventional CVD method. Then, a conventional method is employed to form the nonvolatile memory cell.

In this embodiment, the mask for use when the phosphorus-doped polycrystalline silicon film 75 is etched is the SiO$_2$ patterns 77 and 78 which permits an etching selection ratio with respect to the phosphorus-doped polycrystalline silicon film 75. Therefore, a necessity for raising the aspect ratio of each of the SiO$_2$ patterns 77 and 78 can be eliminated. Therefore, dispersion of the shape of the finished floating gate electrode can considerably be prevented. Moreover, the problem that the SiO$_2$ patterns 77 and 78 fall can be prevented.

In this embodiment, the interval of the SiO$_2$ patterns 77 and 78 is shorter than the width of the SiN pattern 76. Therefore, the interval of the SiO$_2$ patterns 77 and 78 can be reduced exceeding the performance of the lithography.

Since the oxidation of the SiN pattern 76 is performed in the ozone atmosphere, the thermal budget can considerably be reduced. Thus, change in the concentration profile of the dopant introduced into the silicon substrate 71 and deterioration in the reliability of the tunnel oxinitride film 72 dose not raise a problem.

Since the plasma oxidation is not employed, the tunnel oxinitride film 72 is free from any process damage. Therefore, the characteristics of the memory cell are not changed.

The foregoing effects can be obtained from oxidation in an oxygen radical atmosphere as well as the oxidation in the ozone atmosphere. When change in the characteristics of the memory cell caused from the process damage is permitted, a plasma oxidation method in an oxygen atmosphere or an ozone atmosphere can be employed.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:
    forming an insulating film containing silicon and nitrogen on a semiconductor substrate;

forming a film which must be processed and which contains silicon on the insulating film;

processing the film which must be processed to cause a portion of the insulating film to be exposed to the outside; and lowering a surface of the semiconductor substrate under a part of the insulating film relative to a surface of the semiconductor substrate under the film which is processed to cause the portion of the insulating film to be exposed to the outside by applying a thermal oxidation process to a semiconductor structure obtained owing to the above steps, the thermal oxidation process using an oxidizing gas containing one of ozone and oxygen radicals, the oxygen radicals being generated by remote plasma oxidizing method or by reacting a first gas containing oxygen and a second gas containing hydrogen, and a concentration of nitrogen of the part of the insulating film under an edge portion of the film being decreased by the thermal oxidation process.

2. A method of manufacturing a semiconductor device according to claim 1, wherein the insulating film is one of a silicon oxide film containing nitrogen and a silicon nitride film.

3. A method of manufacturing a semiconductor device according to claim 1, wherein the insulating film is a gate insulating film, and the film which must be processed is processed to form a gate electrode.

4. A method of manufacturing a semiconductor device according to claim 1, wherein the insulating film is formed in such a manner that the concentration of nitrogen at an interface of the insulating film with the semiconductor substrate realized before the oxidation process is performed is $5 \times 10^{13}$ cm$^{-2}$ or higher.

5. A method of manufacturing a semiconductor device comprising the steps of:

forming an insulating film containing silicon and nitrogen on a semiconductor substrate;

forming a film which must be processed and which contains silicon on the insulating film;

processing the film which must be processed to cause a portion of the insulating film to be exposed to the outside;

lowering a surface of the semiconductor substrate under a part of the insulating film relative to a surface of the semiconductor substrate under the film which is processed to cause the portion of the insulating film to be exposed to the outside by applying a thermal oxidation process to a semiconductor structure obtained in the above steps, the thermal oxidation process using an oxidizing gas containing one of ozone and oxygen radicals, the oxygen radicals being generated by remote plasma oxidizing method or by reacting a first gas containing oxygen and a second gas containing hydrogen, and a concentration of nitrogen of the part of the insulating film under an edge portion of the film being decreased by the thermal oxidation process; and subjecting the semiconductor structure subjected to the oxidation process to at least one of a nitridation process and an additional oxidation process.

6. A method of manufacturing a semiconductor device according to claim 5, wherein the insulating film is one of a silicon oxide film containing nitrogen and silicon nitride film.

7. A method of manufacturing a semiconductor device according to claim 5, wherein the insulating film is a gate insulating film, and the film which must be processed is processed to form a gate electrode.

8. A method of manufacturing a semiconductor device according to claim 5, wherein the insulating film is formed in such a manner that the concentration of nitrogen at an interface of the insulating film with the semiconductor substrate realized before the oxidation process is performed is not less than $5 \times 10^{13}$ cm$^{-2}$.

9. A method of manufacturing a semiconductor device according to claim 1, wherein the thermal oxidation process using the oxygen radicals is performed at not lower than 900° C.

10. A method of manufacturing a semiconductor device according to claim 5, wherein the thermal oxidation process using the oxygen radicals is performed at not lower than 900° C.

* * * * *